US012777972B2

(12) United States Patent
Chang et al.

(10) Patent No.: US 12,777,972 B2
(45) Date of Patent: Oct. 27, 2026

(54) 3D SEMICONDUCTOR STRUCTURE FOR WIDE-BANDGAP SEMICONDUCTOR DEVICES

(71) Applicant: Taiwan Semiconductor Manufacturing Company, Ltd., Hsinchu (TW)

(72) Inventors: Ting-Fu Chang, Hsinchu City (TW); Jiun-Lei Yu, Zhudong Township (TW); Man-Ho Kwan, Kowloon (HK); Chun-Lin Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 756 days.

(21) Appl. No.: 18/149,712

(22) Filed: Jan. 4, 2023

(65) Prior Publication Data

US 2024/0014176 A1 Jan. 11, 2024

Related U.S. Application Data

(60) Provisional application No. 63/412,565, filed on Oct. 3, 2022, provisional application No. 63/358,292, filed on Jul. 5, 2022.

(51) Int. Cl.
*H10W 90/00* (2026.01)
*H10D 62/85* (2025.01)
(Continued)

(52) U.S. Cl.
CPC ........ *H10W 90/00* (2026.01); *H10D 62/8503* (2025.01); *H10P 54/00* (2026.01);
(Continued)

(58) Field of Classification Search
CPC . H10W 90/00; H10W 90/732; H10W 90/754; H10W 90/722; H10W 74/114;
(Continued)

(56) References Cited

U.S. PATENT DOCUMENTS

2004/0263740 A1 12/2004 Sakakura et al.
2010/0270568 A1 10/2010 Suzuki et al.
(Continued)

FOREIGN PATENT DOCUMENTS

TW 200507032 A 2/2005
TW 202145524 A 12/2021
TW 202211457 A 3/2022

OTHER PUBLICATIONS

Electronic Products. "600-V GaN HEMT targets PFC off-line power supply" Published on Oct. 7, 2013.
(Continued)

*Primary Examiner* — Timor Karimy
(74) *Attorney, Agent, or Firm* — Eschweiler & Potashnik, LLC

(57) ABSTRACT

Various embodiments of the present disclosure are directed towards a three-dimensional (3D) semiconductor structure for wide-bandgap semiconductor devices in which the wide-bandgap semiconductor devices are split amongst a first IC die and a second IC die. The first IC die includes a first substrate and a first semiconductor device. The first substrate includes a first wide-bandgap material, and the first semiconductor device overlies the first substrate and is formed in part by the first wide-bandgap material. The second IC die overlies the first IC die and is bonded to the first IC die by a bond structure between the first and second IC dies. Further, the second IC die includes a second substrate and a second semiconductor device. The second substrate includes a second wide-bandgap material, and the second semicon-
(Continued)

ductor device underlies the second substrate and is formed in part by the second wide-bandgap material.

20 Claims, 23 Drawing Sheets

(51) Int. Cl.
*H10P 54/00* (2026.01)
*H10W 20/20* (2026.01)
*H10W 20/42* (2026.01)
*H10W 74/10* (2026.01)
*H10W 72/00* (2026.01)

(52) U.S. Cl.
CPC ........... *H10W 20/20* (2026.01); *H10W 20/42* (2026.01); *H10W 74/114* (2026.01); *H10W 72/0198* (2026.01); *H10W 72/856* (2026.01); *H10W 90/722* (2026.01); *H10W 90/732* (2026.01); *H10W 90/754* (2026.01)

(58) Field of Classification Search
CPC ... H10W 20/20; H10W 20/42; H10W 72/856; H10W 72/0198; H10D 62/8503; H10P 54/00
See application file for complete search history.

(56) References Cited

U.S. PATENT DOCUMENTS

2012/0280326 A1* 11/2012 Hoffmann .......... H10D 30/0278 257/E21.632
2012/0288995 A1 11/2012 El-Ghoroury et al.
2014/0038359 A1 2/2014 West et al.
2014/0145338 A1 5/2014 Fujii et al.
2018/0025970 A1 1/2018 Kao et al.
2019/0103390 A1 4/2019 Chen et al.
2019/0164914 A1 5/2019 Hu et al.
2019/0363079 A1* 11/2019 Thei .................... H01L 23/3192
2021/0098398 A1 4/2021 Yang et al.
2021/0375806 A1 12/2021 Zhang
2022/0068883 A1 3/2022 Xiao et al.

OTHER PUBLICATIONS

Abdel-Rahman et al. “CoolGaN™ totem-pole PFC design guide and power loss modeling” Published on Aug. 5, 2019.
Yu, Sheng-Yang. “Power Tips: Why is your LLC resonant converter frequency way, way off” Published on Sep. 27, 2015.

* cited by examiner

3D SEMICONDUCTOR STRUCTURE FOR WIDE-BANDGAP SEMICONDUCTOR DEVICES

REFERENCE TO RELATED APPLICATIONS

This application claims the benefit of U.S. Provisional Application No. 63/358,292, filed on Jul. 5, 2022 & U.S. Provisional Application No. 63/412,565, filed on Oct. 3, 2022. The contents of the above-referenced Patent Applications are hereby incorporated by reference in their entirety.

BACKGROUND

Semiconductor devices based on silicon have been the standard for the past few decades. However, semiconductor devices based on gallium nitride (GaN) and the like are increasingly used for power supply/converter applications and radio frequency (RF) applications. Compared to silicon-based semiconductor devices, semiconductor devices based on GaN and the like have wide bandgaps. Among other things, the wide bandgaps enable operation at high frequencies, high voltages, and high temperatures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
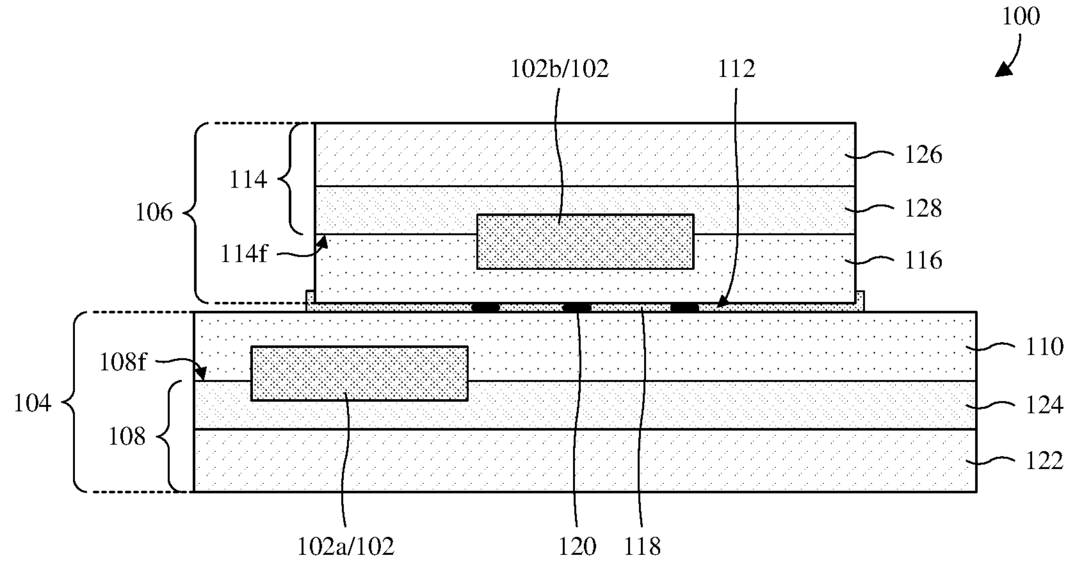
FIG. 1 illustrates a cross-sectional view of some embodiments of a three-dimensional (3D) semiconductor structure for wide-bandgap semiconductor devices.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) devices used for power management and the like commonly include a half-bridge circuit. The circuit comprises a high-side transistor and a low-side transistor having individual source/drain regions electrically coupled to an output node. The high-side transistor is configured to pull the output node to a high voltage, and the low-side transistor is configured to pull the output node to a low voltage.

The half-bridge circuit may be implemented with silicon, whereby n/p junctions may be used to isolate the high-side and low-side transistors from each other. However, in an effort to improve performance, there has been a move towards gallium nitride (GaN) and the like. Among other things, GaN enables the high-side and low-side transistors to operate at higher frequencies, higher voltages, and higher temperatures. However, n/p junctions are not available to isolate the high-side and low-side transistors from each other when using GaN. As such, the common substrate may act as a back gate that degrades switching performance. For example, supposing the high-side voltage is 50 volts, the low-side voltage is 0 volts, and the common substrate is biased with the low-side voltage, the common substrate may act as a back gate with an effective voltage of −50 volts at the high-side transistor. This effective voltage may increase the difficulty of switching the high-side transistor on and off.

A first approach to mitigate the back-gating effect is to use discrete high-side and low-side transistors electrically coupled together by wire bonding or the like. However, this approach occupies a large area and leads to long conductive paths interconnecting the high-side and low-side transistors. The long conductive paths have high parasitic inductance that leads to ringing during switching and that hence reduces switching performance.

A second approach to mitigate the back-gating effect is to use a common GaN-on-silicon-on-insulator (SOI) substrate together with deep trench isolation (DTI). However, the GaN-on-SOI substrate has high cost. Further, the high-side and low-side transistors are effectively discrete devices, whereby the high-side and low-side transistors are electrically coupled together by wire bonding or the like. As such, the second approach suffers from the same problems (e.g., parasitic inductance, large area, etc.) as the first approach.

Various embodiments of the present disclosure are directed towards a three-dimensional (3D) semiconductor structure for wide-bandgap semiconductor devices in which the wide-bandgap semiconductor devices are split amongst a first IC die and a second IC die. The first IC die comprises a first substrate and a first semiconductor device. The first substrate comprises a first wide-bandgap material, such as, for example, GaN or the like, and the first semiconductor device overlies the first substrate and is formed in part by the first wide-bandgap material. The second IC die overlies the first IC die and is bonded to the first IC die by a bond structure between the first and second IC dies. The bond structure both physically and electrically couples the first and second IC dies together. Further, the second IC die comprises a second substrate and a second semiconductor device. The second substrate comprises a second wide-bandgap material, such as, for example, GaN or the like, and the second semiconductor device underlies the second substrate and is formed in part by the second wide-bandgap material. In some embodiments, the first and second wide-bandgap materials are the same.

The 3D semiconductor structure may, for example, be or comprise a half-bridge circuit in which the first and second semiconductor devices correspond to a low-side transistor and a high-side transistor or vice versa. Because the high-side and low-side transistors are on separate substrates, the high-side and low-side transistors are isolated from each other and the back-gating effect is mitigated. Because the first and second IC dies are bonded and electrically coupled together by the bond structure, wire bonding between the high-side and low-side transistors is avoided and conductive paths between the high-side and low-side transistors are short. As such, parasitic inductance and ringing are low. Collectively, the foregoing may lead to high performance for the half-bridge circuit.

Because the high-side and low-side transistors are vertically stacked, area occupied by the half-bridge circuit is small. Because the first and second IC dies are vertically stacked, the half-bridge circuit may be formed by chip-on-wafer (CoW) manufacturing processes, wafer-on-wafer (WoW) manufacturing process, or the like. Such manufacturing processes simplify manufacture of the half-bridge circuit. Collectively, the foregoing may lead to low costs and high manufacturing yields.

With reference to FIG. 1, a cross-sectional view 100 of some embodiments of a 3D semiconductor structure for wide-bandgap semiconductor devices 102 is provided in which the wide-bandgap semiconductor devices 102 are split amongst a first IC die 104 and a second IC die 106. A wide-bandgap material may, for example, be a semiconductor material having a band gap greater than a bandgap of silicon or the like and/or having a band gap greater than about 2 electron volts (eV) or some other suitable value. As such, the wide-bandgap semiconductor devices 102 may, for example, be GaN transistors or the like.

The first IC die 104 comprises a first substrate 108, a first semiconductor device 102*a*, and a first interconnect structure 110. The first substrate 108 comprises a first wide-bandgap material. The first semiconductor device 102*a* overlies the first substrate 108 on a frontside 108*f* of the first substrate 108, and is formed in part by the first wide-bandgap material. The first interconnect structure 110 overlies and electrically couples to the first semiconductor device 102*a* on the frontside 108*f* of the first substrate 108.

The second IC die 106 overlies and is bonded to the first IC die 104 through a bond structure 112, which both physical and electrically couples the first and second IC dies 104, 106 together. Further, the second IC die 106 comprises a second substrate 114, a second semiconductor device 102*b*, and a second interconnect structure 116. The second substrate 114 comprises a second wide-bandgap material, which may be the same or different than the first wide-bandgap material. The second semiconductor device 102*b* underlies the second substrate 114 on a frontside 114*f* of the second substrate 114, and is formed in part by the second wide-bandgap material. The second interconnect structure 116 underlies and electrically couples to the second semiconductor device 102*b* on the frontside 114*f* of the second substrate 114.

In some embodiments, the first and second semiconductor devices 102*a*, 102*b* form a half-bridge circuit in which the first and second semiconductor devices 102*a*, 102*b* correspond to a low-side transistor and a high-side transistor or vice versa. Because the high-side and low-side transistors are on separate substrates (e.g., the first and second substrates 108, 114), the high-side and low-side transistors are isolated from each other. Further, the substrates may have different bias voltages to mitigate the back-gating effect. Because the first and second IC dies 104, 106 are bonded and electrically coupled together through the bond structure 112, wire bonding between the high-side and low-side transistors is avoided and conductive paths between the high-side and low-side transistors are short. As such, parasitic inductance and ringing are low. Collectively, the foregoing may lead to high performance.

Because the high-side and low-side transistors are vertically stacked, area occupied by the half-bridge circuit is small. Because the first and second IC dies 104, 106 are vertically stacked, the half-bridge circuit may be formed by CoW manufacturing processes, WoW manufacturing process, or the like. Such manufacturing processes simplify manufacture of the half-bridge circuit. Collectively, the foregoing may lead to low costs and high manufacturing yields.

With continued reference to FIG. 1, the first and second IC dies 104, 106 are bonded together frontside to frontside through the bond structure 112. By frontside to frontside, it is meant that the frontside 108*f* of the first substrate 108 and the frontside 114*f* of the second substrate 114 face each other. As seen above, the frontside 108*f* of the first substrate 108 corresponds to a side of the first substrate 108 on which the first semiconductor device 102*a* is arranged. Further, the frontside 114*f* of the second substrate 114 corresponds to a side of the second substrate 114 on which the second semiconductor device 102*b* is arranged.

The bond structure 112 comprises an adhesive layer 118 and a plurality of bumps 120 embedded in the adhesive layer 118. The adhesive layer 118 is dielectric, whereas the bumps 120 are conductive. The bumps 120 electrically couple the first and second IC dies 104, 106 together. The adhesive layer 118 and the bumps 120 physically secure the first and second IC dies 104, 106 together.

The first and second interconnect structures 110, 116 form conductive paths electrically coupling the first and second semiconductor devices 102*a*, 102*b* together to form a circuit. As noted above, the circuit may, for example, be a half-bridge circuit or the like. The first and second interconnect structures 110, 116 may comprise stacks of conductive features (not shown) embedded in corresponding interconnect dielectric layers (not shown). The conductive features form the conductive paths and may, for example, comprise vias, contacts, wires, pads, the like, or any combination of the foregoing.

The first substrate 108 comprises a first carrier substrate 122 and a first semiconductor layer 124, whereas the second substrate 114 comprises a second carrier substrate 126 and a second semiconductor layer 128. The first and second semiconductor layers 124, 128 are respectively on the first and second carrier substrates 122, 126 and respectively comprise the first and second wide-bandgap materials. The first and second carrier substrates 122, 126 respectively support the first and second semiconductor layers 124, 128.

In some embodiments, one or each of the first and second carrier substrates 122, 126 is or comprises silicon, silicon carbide, sapphire, diamond, or the like. In some embodiments, the first carrier substrate 122 is a crystalline material suitable for epitaxially growing the first semiconductor layer 124 on the first carrier substrate 122. In some embodiments, the second carrier substrate 126 is a crystalline material suitable for epitaxially growing the second semiconductor layer 128 on the second carrier substrate 126. In some embodiments, the first and second carrier substrates 122, 126 are the same material. In other embodiments, the first and second carrier substrates 122, 126 are different materials.

In some embodiments, one or each of the first and second carrier substrates 122, 126 is a semiconductor. For example, one or each of the first and second carrier substrates 122, 126 may be silicon, silicon carbide, diamond, or the like. In some embodiments, one or each of the first and second carrier substrates 122, 126 is a ceramic. For example, one or each of the first and second carrier substrates 122, 126 may be sapphire or the like.

In some embodiments, the first carrier substrate 122 has a bandgap less than a bandgap of the first semiconductor layer 124 and/or the second carrier substrate 126 has a bandgap less than a bandgap of the second semiconductor layer 128. For example, the first carrier substrate 122 may be silicon or the like and the first semiconductor layer 124 may be GaN or the like. In some embodiments, the first carrier substrate 122 has a bandgap greater than a bandgap of the first semiconductor layer 124 and/or the second carrier substrate 126 has a bandgap greater than a bandgap of the second semiconductor layer 128. For example, the first carrier substrate 122 may be diamond or the like and the first semiconductor layer 124 may be GaN or the like. In some embodiments, one or each of the first and second carrier substrates 122, 126 has a bandgap of about 1-2 eV, about 2-3.2 eV, or about 4-6 eV. Notwithstanding the foregoing bandgap values, other suitable values are amenable.

In some embodiments, one or each of the first and second carrier substrates 122, 126 has a low resistance. A low resistance may, for example, be a resistance less than about 30 ohms/centimeter (0/cm), about 20 it/cm, about 10 it/cm, or about 1 it/cm. In some embodiments, one or each of the first and second carrier substrates 122, 126 has a high resistance. A high resistance may, for example, be a resistance greater than about 1 kilo-ohms/centimeter (kΩ/cm), about 1.8 kΩ/cm, or about 3 kΩ/cm, and/or may, for example, be about 1-1.8 kΩ/cm or about 1.8-3 kΩ/cm. In some embodiments, one or each of the first and second carrier substrates 122, 126 has a resistance that is about 100-500 Ω/cm, about 100-300 Ω/cm, or about 300-500 Ω/cm, and/or the second carrier substrate 122 has a resistance that is about 100-500 Ω/cm, about 100-300 Ω/cm, or about 300-500 Ω/cm. Notwithstanding the foregoing resistance values, other suitable resistance values are amenable.

In some embodiments, one or each of the first and second semiconductor layers 124, 128 is or comprises one or more group III-V materials, one or more other wide bandgap materials, or any combination of the foregoing. A wide-bandgap material may, for example, be a semiconductor material having a band gap greater than a bandgap of silicon or the like and/or having a band gap greater than about 2 electron volts or some other suitable value. In some embodiments, one or each of the first and second semiconductor layers 124, 128 is or comprises GaN, aluminum gallium nitride (AlGaN), the like, or any combination of the foregoing. In some embodiments, the first and second semiconductor layers 124, 128 are the same material. In other embodiments, the first and second semiconductor layers 124, 128 are different materials.

In some embodiments, one or each of the first and second semiconductor layers 124, 128 has a bandgap that is: 1) greater than about 1.12 eV, about 2 eV, about 3 eV, or some other suitable value; 2) greater than a band gap of silicon or the like; 3) about 2-3 eV, about 3-4 eV, or some other suitable value; 4) or any combination of the foregoing. In some embodiments, the first and second semiconductor layers 124, 128 have the same bandgap. In other embodiments, the first and second semiconductor layers 124, 128 have different band gaps.

To the extent that the first semiconductor layer 124 is or comprises GaN and the first carrier substrate 122 is silicon, silicon carbide, sapphire, or diamond, the first substrate 108 may, for example, be regarded respectively as a GaN-on-silicon substrate, a GaN-on-silicon-carbide substrate, or a GaN-on-sapphire substrate, or a GaN-on-diamond substrate. Similarly, to the extent that the second semiconductor layer 128 is or comprises GaN and the second carrier substrate 126 is silicon, silicon carbide, sapphire, or diamond, the second substrate 114 may, for example, be regarded respectively as a GaN-on-silicon substrate, a GaN-on-silicon-carbide substrate, or a GaN-on-sapphire substrate, or a GaN-on-diamond substrate.

In some embodiments, the first and second semiconductor layers 124, 128 are or comprises GaN, and the first and second carrier substrates 122, 126 are or comprises silicon, silicon carbide, sapphire, or diamond. In at least some of such embodiments, the first and second semiconductor devices 102*a*, 102*b* are GaN high-electron-mobility transistor (HEMTs), GaN metal-oxide-semiconductor field-effect transistors (MOSFETs), or the like. Different material types and/or device types are, however, amenable in alternative embodiments.

While the first and second semiconductor devices 102*a*, 102*b* are shown as having the same size, the first and second semiconductor devices 102*a*, 102*b* may have different sizes in alternative embodiments. Also, while the first and second semiconductor devices 102*a*, 102*b* are shown as being misaligned (e.g., laterally offset from each other), the first and second semiconductor devices 102*a*, 102*b* may be aligned with each other in alternative embodiments.

Figure 2:
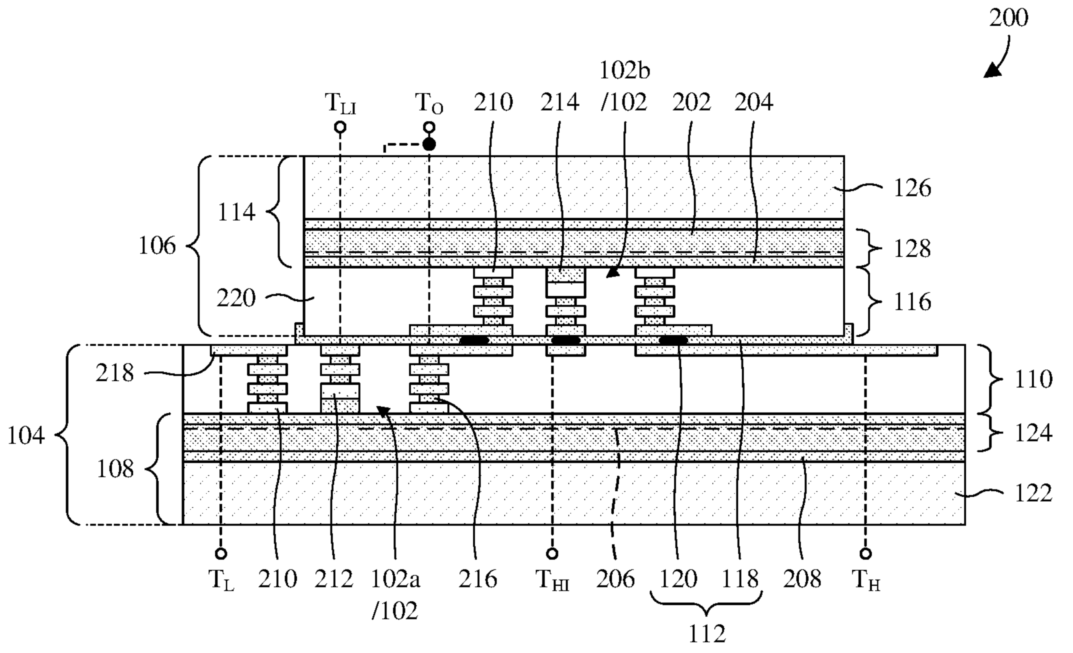
FIG. 2 illustrates a cross-sectional view of some embodiments of the 3D semiconductor structure of FIG. 1 in which additional detail is shown.

With reference to FIG. 2, a cross-sectional view 200 of some embodiments of the 3D semiconductor structure of FIG. 1 is provided in which additional detail is shown. The first and second semiconductor layers 124, 128 comprise individual channel layers 202 and individual barrier layers 204. The channel layers 202 and the barrier layers 204 are semiconductor layers, and the channel layers 202 have different bandgaps than the barrier layers 204. In some embodiments, the channel and barrier layers 202, 204 are or comprise group III-V semiconductor materials, other wide-bandgap materials, or the like.

The channel layers 202 respectively and directly contact the barrier layers 204 at heterojunctions. Further, the channel layers 202 accommodate two-dimensional (2D) carrier gases 206. For example, the channel layers 202 may accommodate 2D electron gases or 2D hole gases. The barrier layers 204 are polarized to promote formation of the 2D carrier gases 206. The polarization may, for example, result from spontaneous polarization effects, piezoelectric polarization effects, the like, or any combination of the foregoing.

In some embodiments, the channel layers 202 are or comprise GaN, whereas the barrier layers 204 are or comprises AlGaN, or vice versa. As such, in some embodiments, the channel layers 202 are or comprise a group III-V semiconductor (e.g., GaN or the like) and the barrier layers 204 are or comprises the group III-V semiconductor plus an additional element (e.g., aluminum or the like). Notwithstanding the specific semiconductor materials and/or elements above, other suitable semiconductor materials and/or elements are amenable.

Buffer layers 208 individual to the first and second semiconductor layers 124, 128 separate the first and second semiconductor layers 124, 128 respectively from the first and second carrier substrates 122, 126. In some embodiments, the buffer layers 208 serve as seed or nucleation layers for epitaxially growing corresponding semiconductor layers 124, 128. Further, in some embodiments, the buffer layers 208 serve to buffer mismatches between lattice constants, coefficients of thermal expansion, and so on between corresponding carrier substrates 122, 126 and corresponding semiconductor layer 124, 128.

In some embodiments, the buffer layers 208 are semiconductor layers. Further, in some embodiments in which the channel layers 202 are GaN and the barrier layers 204 are AlGaN, the buffer layers 208 may be or comprise aluminum nitride (AlN), AlGaN, GaN, some other suitable material, or any combination of the foregoing.

The first and second semiconductor devices 102*a*, 102*b* are HEMTs. However, one or both of the first and second semiconductor devices 102*a*, 102*b* may alternatively be a MOSFET or some other suitable type of semiconductor device. The first and second semiconductor devices 102*a*, 102*b* comprise individual pairs of source/drain electrodes 210, individual gate electrodes 212, and individual cap layers 214. Source/drain electrode(s) may refer to a source or a drain, individually or collectively dependent upon the context.

The gate electrodes 212 are laterally between corresponding source/drain electrodes 210, and the cap layers 214 separate corresponding gate electrodes 212 from corresponding semiconductor layers 124, 128. The source/drain electrodes 210 and the gate electrodes 212 are conductive and may, for example, be metal or the like. The cap layers 214 are semiconductor materials and are polarized to change the conductivity of corresponding 2D carrier gases 206. For example, the cap layer 214 of the first semiconductor device 102*a* may deplete the corresponding 2D carrier gas 206 of mobile carriers at the gate electrode 212 of the first semiconductor device 102*a*. In some embodiments, the cap layers 214 are doped and/or are group III-V materials, a wide-bandgap material, or the like. For example, the cap layers 214 may be or comprise p-doped GaN or some other suitable semiconductor material.

The first and second interconnect structures 110, 116 form conductive paths electrically coupling the first and second semiconductor devices 102*a*, 102*b* together to form a half-bridge circuit. For example, a drain one of the source/drain electrodes 210 of the first semiconductor device 102*a* may be electrically coupled to a source one of the source/drain electrodes 210 of the second semiconductor device 102*b*. In alternative embodiments, the conductive paths electrically couple the first and second semiconductor devices 102*a*, 102*b* together to form some other suitable circuit. Further, the first and second interconnect structures 110, 116 comprise a plurality of vias 216 and a plurality of wires 218 that are stacked in corresponding interconnect dielectric layers 220 to form the conductive paths.

The vias 216 are grouped into a plurality of via levels, and the wires 218 are grouped into a plurality of wire levels. Wire and via levels in the first interconnect structure 110 are alternatingly stacked from the first semiconductor device 102*a* to the bond structure 112. Further, wire and via levels in the second interconnect structure 116 are alternatingly stacked from the second semiconductor device 102*b* to the bond structure 112. The vias 216 and the wires 218 are conductive and may, for example, be or comprise copper, aluminum, aluminum copper, the like, or any combination of the foregoing.

At least some opposing wires at the bond structure 112 are electrically coupled together by the bumps 120. Further, at least some wires at a top of the first interconnect structure 110 serve as pads for electrically coupling the first and second semiconductor devices 102*a*, 102*b* to external structures. The pads form or are otherwise electrically coupled respectively to a low-side input terminal $T_{LI}$, a high-side input terminal $T_{HI}$, an output terminal $T_O$, a low-side terminal $T_L$, and a high-side terminal $T_H$. Further, the pads are partially uncovered by the second IC die 106 due to the second IC die 106 having a lesser width than the first IC die 104. As better seen hereafter, the output terminal $T_O$ is also electrically coupled to the second carrier substrate 126 to mitigate a back-gating effect that would otherwise occur if the second carrier substrate 126 was biased with the same bias voltage as the first carrier substrate 122.

Figure 3:
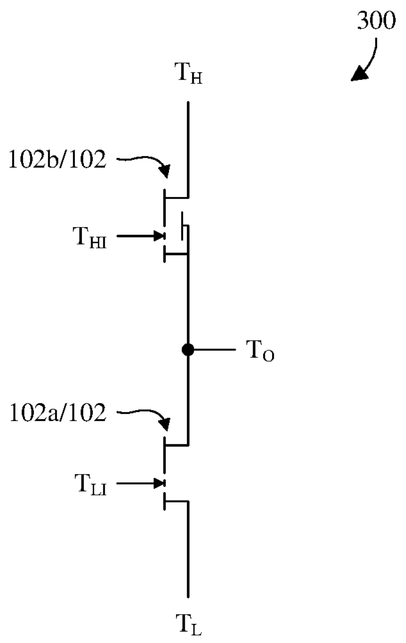
FIG. 3 illustrates a circuit diagram of some embodiments of a half-bridge circuit of the 3D semiconductor structure of FIG. 2.

With reference to FIG. 3, a circuit diagram 300 of some embodiments of the half-bridge circuit of the 3D semiconductor structure of FIG. 2 is provided. The first semiconductor device 102*a* is electrically coupled from the low-side terminal $T_L$ to the output terminal $T_O$, and the second semiconductor device 102*b* is electrically coupled from the output terminal $T_O$ to the high-side terminal $T_H$. The first semiconductor device 102*a* forms a low-side transistor, which is gated by a signal at the low-side input terminal $T_{LI}$. The second semiconductor device 102*b* forms a high-side transistor, which is gated by a signal at the high-side input terminal Tim In some embodiments, a voltage at the high-side terminal $T_H$ is about 100-1000 volts, about 100-550 volts, about 550-1000 volts, about 650 volts, or some other suitable voltage, and/or a voltage at the low-side terminal $T_L$ is about 0 volts (e.g., ground) or some other suitable voltage.

Figure 4A:
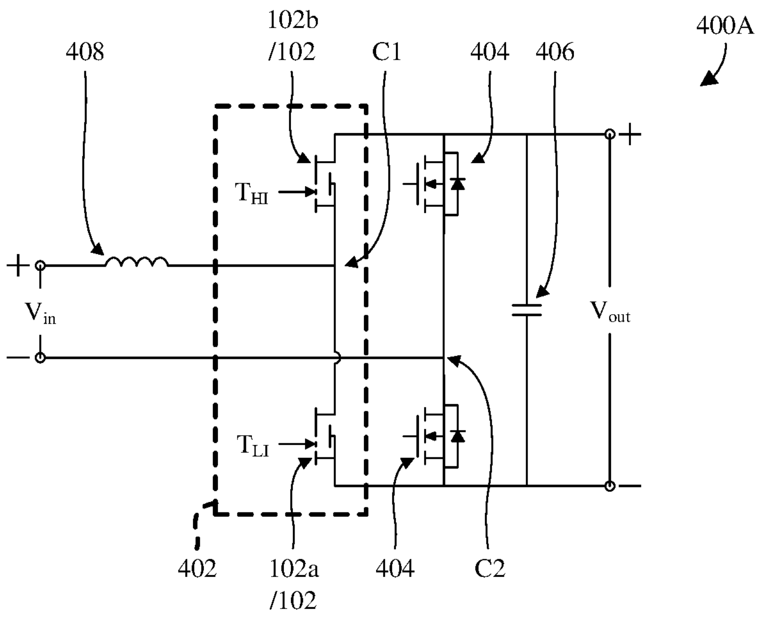
FIGS. 4A and 4B illustrate circuit diagrams respectively of some embodiments of power converter circuits comprising the half-bridge circuit of FIGS. 2 and 3.
Figure 4B:
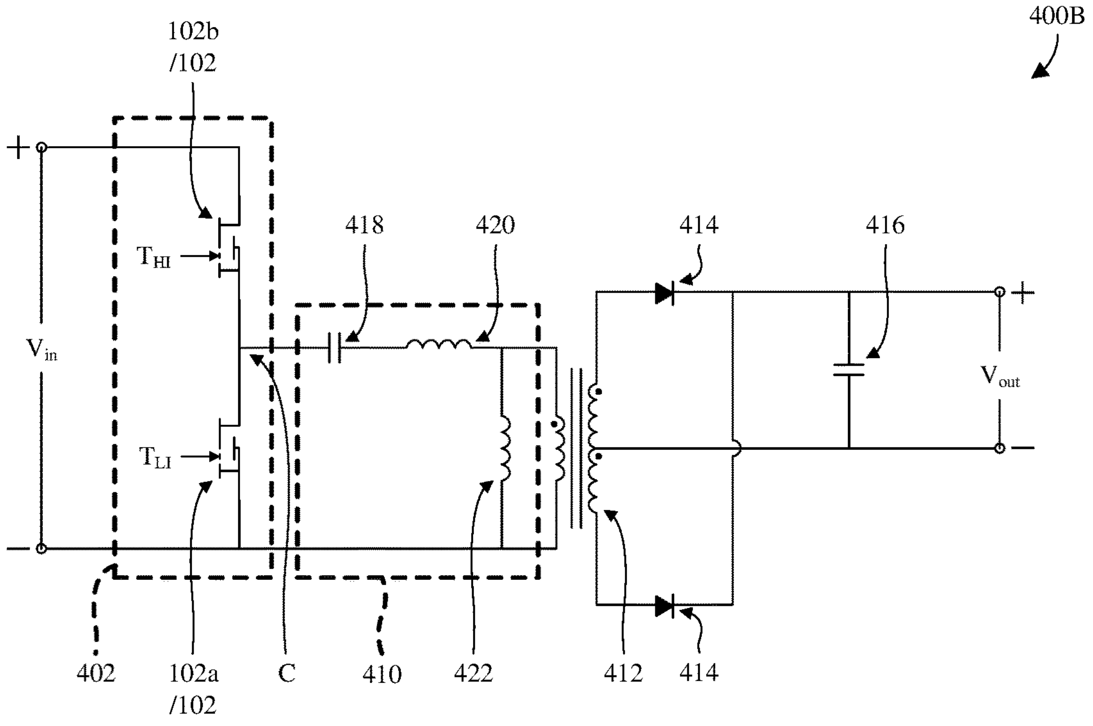

With reference to FIGS. 4A and 4B, circuit diagrams 400A, 400B respectively of some embodiments of power converter circuits comprising the half-bridge circuit of FIGS. 2 and 3 (labeled as 402) are provided.

As illustrated by the circuit diagram 400A of FIG. 4A, a totem-pole power factor correction (PFC) circuit comprises the half-bridge circuit 402. An alternating current (AC) input voltage $V_{in}$ is input into the totem-pole PFC circuit, and a direct current (DC) output voltage $V_{out}$ is output from the totem-pole PFC circuit. The AC input voltage $V_{in}$ may, for example, be about 150-300 volts, about 300-450 volts, about 450-650 volts, or some other suitable voltage, and/or the DC output voltage $V_{out}$ May, for Example, be about 150-300 Volts, about 300-450 Volts, about 450-650 volts, or some other suitable voltage. In some embodiments, the AC input voltage $V_{in}$ is about 208 volts or some other suitable voltage, and the DC output voltage $V_{out}$ is about 400 volts or some other suitable voltage.

In addition to the half-bridge circuit 402, the totem-pole PFC circuit comprises a pair of MOSFETs 404, a capacitor 406, and an inductor 408. A positive input terminal of the totem-pole PFC circuit is electrically coupled to a first common node C1 between the first and second semiconductor devices 102*a*, 102*b* of the half-bridge circuit 402 by the inductor 408. A negative input terminal is electrically coupled to a second common node C2 between the MOSFETs 404. The first and second semiconductor devices 102*a*, 102*b* are electrically coupled from the first common node C1 respectively to a positive output terminal and a negative output terminal. The MOSFETs 404 are electrically coupled from the second common node C2 respectively to the positive output terminal and the negative output terminal. The capacitor 406 is electrically coupled from the positive output terminal to the negative output terminal.

As illustrated by the circuit diagram 400B of FIG. 4B, an LLC converter circuit comprises the half-bridge circuit 402. A DC input voltage $V_{in}$ is input into the LLC converter circuit, and a DC output voltage $V_{out}$ is output from the LLC converter circuit. The DC input voltage $V_{in}$ may, for example, be about 150-300 volts, about 300-450 volts, about 450-650 volts, or some other suitable voltage, and/or the DC output voltage $V_{out}$ may, for example, be about 1-20 volts, about 30-140 volts, or some other suitable voltage. In some embodiments, the DC input voltage $V_{in}$ is about 400 volts or some other suitable voltage, and the DC output voltage $V_{out}$ is about 48 volts, about 12 volts, about 5 volts, or some other suitable voltage.

In addition to the half-bridge circuit 402, the LLC converter circuit further comprises a resonant tank circuit 410, a transformer 412, a pair of diodes 414, and an output capacitor 416. The first and second semiconductor devices 102*a*, 102*b* are electrically coupled from a common node C respectively to the positive input terminal and the negative input terminal.

An input of the resonant tank circuit 410 is electrically coupled in parallel with the first semiconductor device 102*a*, and an output of the resonant tank circuit 410 is electrically coupled in parallel with a primary winding of the transformer 412. The resonant tank circuit 410 comprises a resonant capacitor 418, a resonant inductor 420, and a magnetic inductor 422 of the transformer 412. The resonant capacitor 418 and the resonant inductor 420 are electrically coupled in series from the common node C to the magnetic inductor 422 and the transformer 412. The magnetic inductor 422 is electrically coupled in parallel with the primary winding of the transformer 412, from the resonant inductor 420 to the negative input terminal.

The diodes 414 have individual anodes electrically coupled to opposite ends of the secondary winding of the transformer 412, and further have individual cathodes electrically coupled to a positive output terminal. The output capacitor 416 is electrically coupled from the positive output terminal to a negative output terminal, which is electrically coupled to a center tap at the secondary winding of the transformer 412.

In some embodiments, an input of the LLC converter circuit of FIG. 4B is electrically coupled to an output of the totem-pole power factor correction (PFC) circuit of FIG. 4A. In other words, $V_{in}$ of FIG. 4B and $V_{out}$ of FIG. 4A are one and the same. In alternative embodiments, the input of the LLC converter circuit of FIG. 4B is electrically coupled to an output of a full-wave rectifier circuit or some other suitable AC-to-DC power converter circuit.

Figure 5:
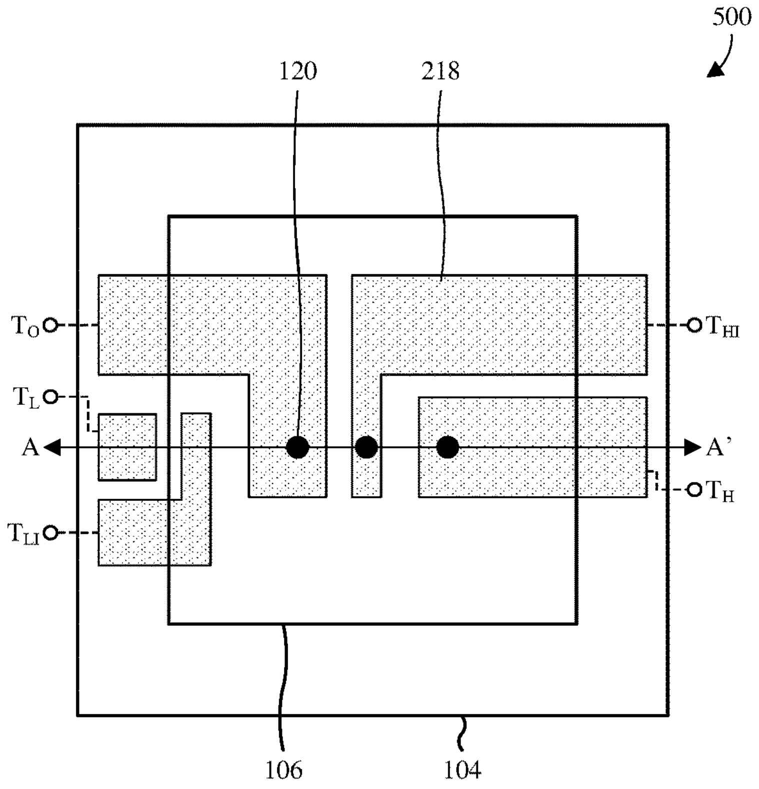
FIG. 5 illustrates a top layout view of some embodiments of the 3D semiconductor structure of FIG. 2.

With reference to FIG. 5, a top layout view 500 of some embodiments of the 3D semiconductor structure of FIG. 2 is provided. The top layout view 500 is taken at an interface between the bumps 120 and the first interconnect structure 110 to illustrate wires 218 of the first interconnect structure 110 serving as pads. Further, the cross-sectional view 200 of FIG. 2 may, for example, be taken along line A-A' in FIG. 5.

The first and second IC dies 104, 106 have square top geometries. In alternative embodiments, the first IC die 104 has some other suitable top geometry and/or the second IC die 106 has some other suitable top geometry. Further, the second IC die 106 is smaller than the first IC die 104, such that a top portion of the first IC die 104 is exposed. The wires 218 serving as pads are arranged in or otherwise extend to this exposed top portion so as to form or otherwise electrically couple with the terminals of the 3D semiconductor structure. These terminals include the low-side input terminal $T_{LI}$, the high-side input terminal Tin, the output terminal $T_O$, the low-side terminal $T_L$, and the high-side terminal $T_H$.

Figure 6:
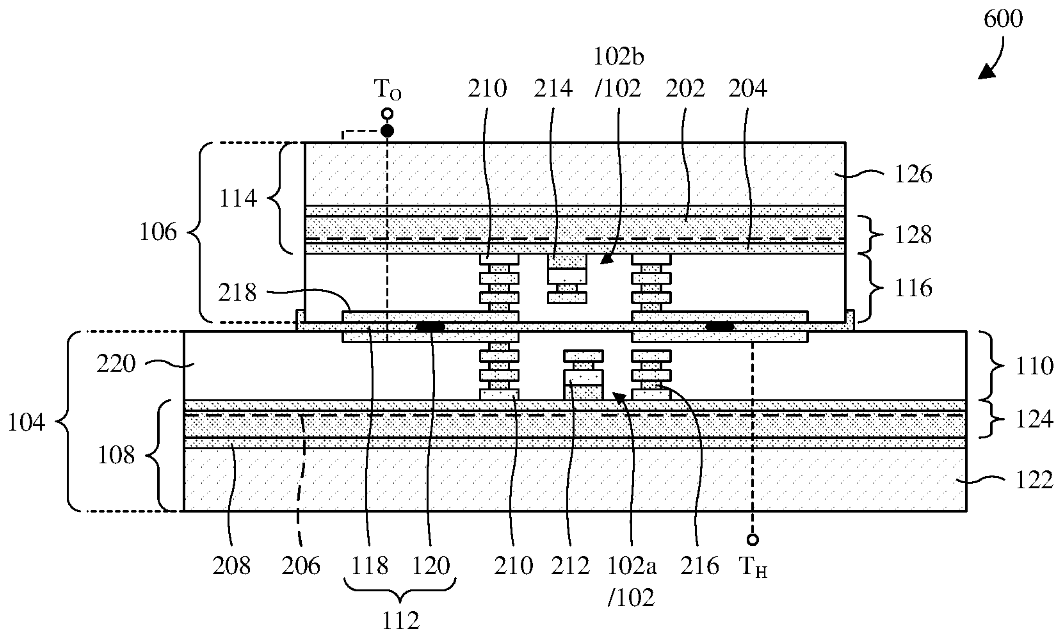
FIGS. 6 and 7 respectively illustrate a cross-sectional view and a top layout view of some alternative embodiments of the 3D semiconductor structure of FIG. 2 in which a first semiconductor device is centered.

With reference to FIG. 6, a cross-sectional view 600 of some alternative embodiments of the 3D semiconductor structure of FIG. 2 is provided in which the first semiconductor device 102*a* is at a center of the first IC die 104. As a result, the first and second semiconductor devices 102*a*, 102*b* are aligned and the wires 218 and the vias 216 have a different layout.

Figure 7:
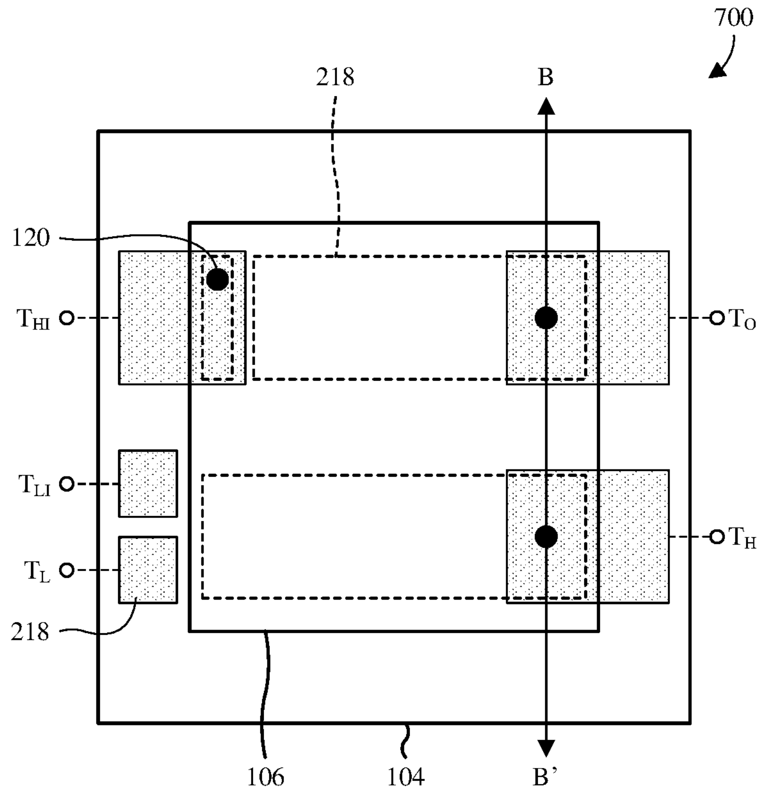

With reference to FIG. 7, a top layout view 700 of some embodiments of the 3D semiconductor structure of FIG. 6 is provided. The top layout view 700 is taken at an interface between the bumps 120 and the first interconnect structure 110 to illustrate wires 218 of the first interconnect structure 110 serving as pads. Further, the top layout view 700 illustrates the wires 218 of the second interconnect structure 116 at the bumps 120 in phantom. The cross-sectional view 600 of FIG. 6 may, for example, be taken along line B-B' in FIG. 7.

Figure 8:
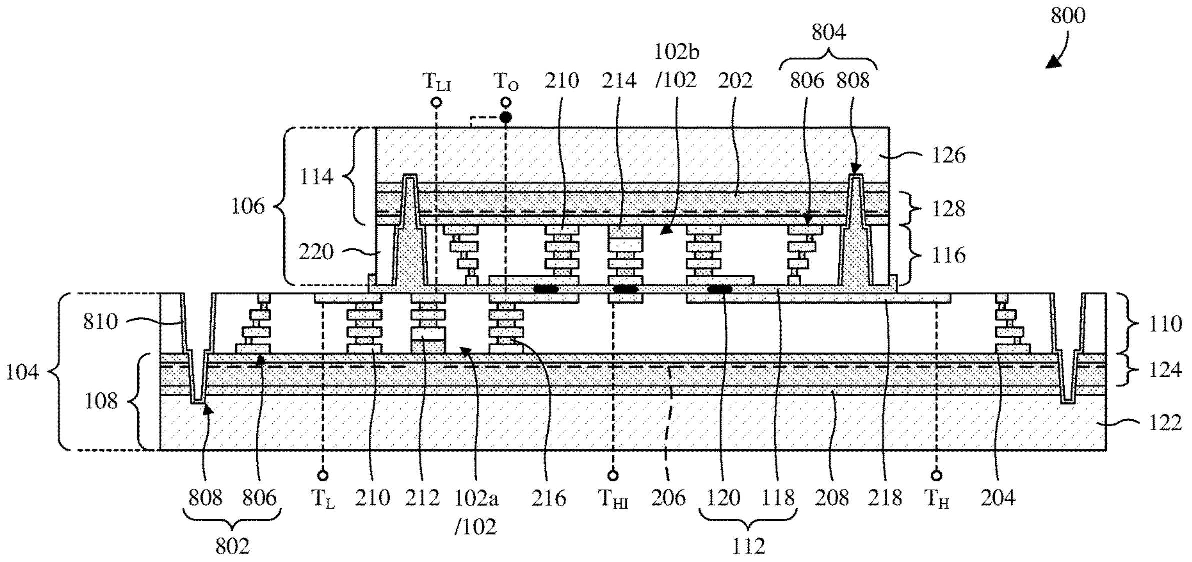
FIG. 8 illustrates a cross-sectional view of some alternative embodiments of the 3D semiconductor structure of FIG. 2 in which IC dies comprise seal rings.

With reference to FIG. 8, a cross-sectional view 800 of some alternative embodiments of the 3D semiconductor structure of FIG. 2 is provided in which the first and second IC dies 104, 106 respectively comprise a first seal ring 802 and a second seal ring 804. The first seal ring 802 extends in a closed path along a periphery of the first IC die 104 to surround the first semiconductor device 102*a*. Similarly, the second seal ring 804 extends in a closed path along a periphery of the second IC die 106 to surround the second semiconductor device 102*b*.

The first and second IC dies 104, 106 may be formed in bulk on corresponding wafers. For example, the first IC die 104 may repeat in a grid pattern across the corresponding wafer. As such, the first and second IC dies 104, 106 may undergo singulation processes in which a die saw separates instances of the first and second IC dies 104, 106 from each other. The first and second seal rings 802, 804 provide stress relief during the singulation processes that may prevent cracking and other deleterious effects from the singulation processes.

The first and second seal rings 802, 804 comprise individual conductive walls 806 and individual through semiconductor vias 808. The conductive walls 806 and the through semiconductor vias 808 extend laterally in individual closed paths along the peripheries of corresponding IC dies (e.g., the first IC die 104 and/or the second IC die 106). Further, the conductive walls 806 are surrounded respectively by the through semiconductor vias 808.

The conductive walls 806 are formed by the wires 218 and the vias 216 respectively of the first and second interconnect structures 110, 116. Further, the conductive walls 806 extend vertically respectively through the first and second interconnect structures 110, 116. The through semiconductor vias 808 correspond to trenches lined by via liners 810. The through semiconductor vias 808 extend vertically respectively through the first and second semiconductor layers 124, 128 and vertically respectively through the first and second interconnect structures 110, 116. Further, the through semiconductor vias 808 extend vertically respectively into the first and second carrier substrates 122, 126. The through semiconductor via 808 of the second IC die 106 is filled with the adhesive layer 118, and the through semiconductor via 808 of the first IC die 104 is unfilled with the adhesive layer 118.

Figure 9:
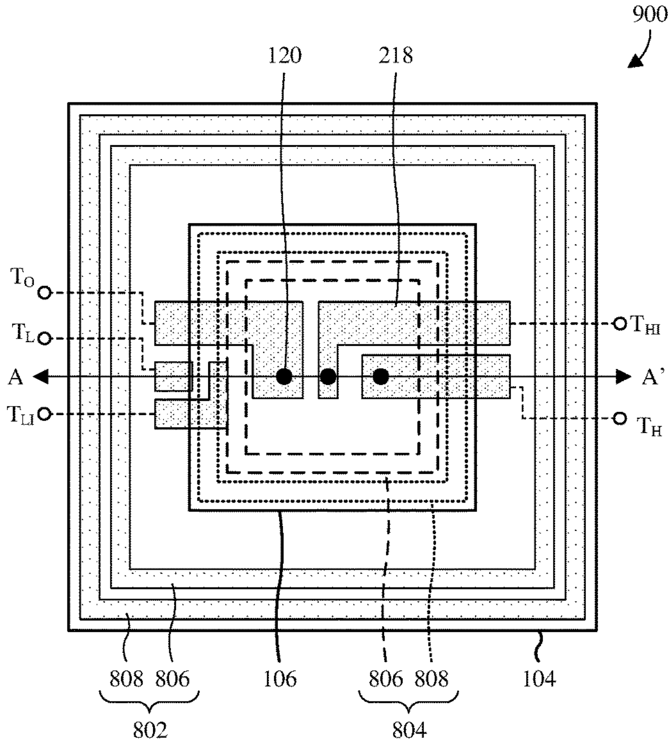
FIG. 9 illustrates a top layout view of some embodiments of the 3D semiconductor structure of FIG. 8.

With reference to FIG. 9, a top layout view 900 of some embodiments of the 3D semiconductor structure of FIG. 8 is provided. The top layout view 900 is taken at an interface between the bumps 120 and the first interconnect structure 110 to illustrate wires 218 of the first interconnect structure 110 serving as pads. Further, the cross-sectional view 800 of FIG. 8 may, for example, be taken along line A-A' in FIG. 9.

Figure 10:
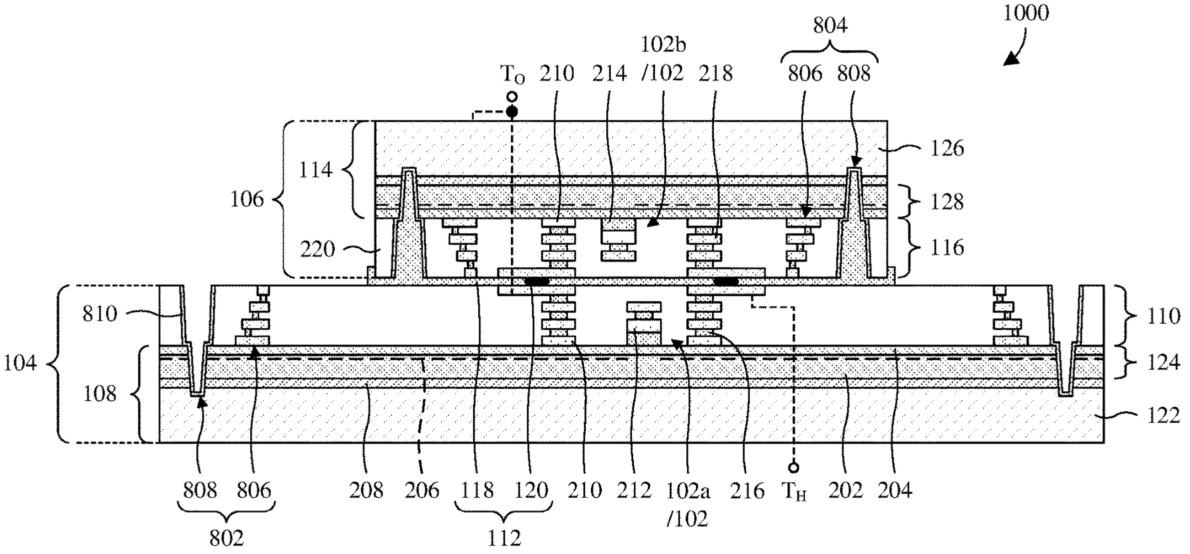
FIGS. 10 and 11 respectively illustrate a cross-sectional view and a top layout view of some alternative embodiments of the 3D semiconductor structure of FIG. 8 in which a first semiconductor device is centered.

With reference to FIG. 10, a cross-sectional view 1000 of some alternative embodiments of the 3D semiconductor structure of FIG. 8 is provided in which the first semiconductor device 102*a* is at a center of the first IC die 104. As a result, the first and second semiconductor devices 102*a*, 102*b* are aligned and the wires 218 and the vias 216 have a different layout.

Figure 11:
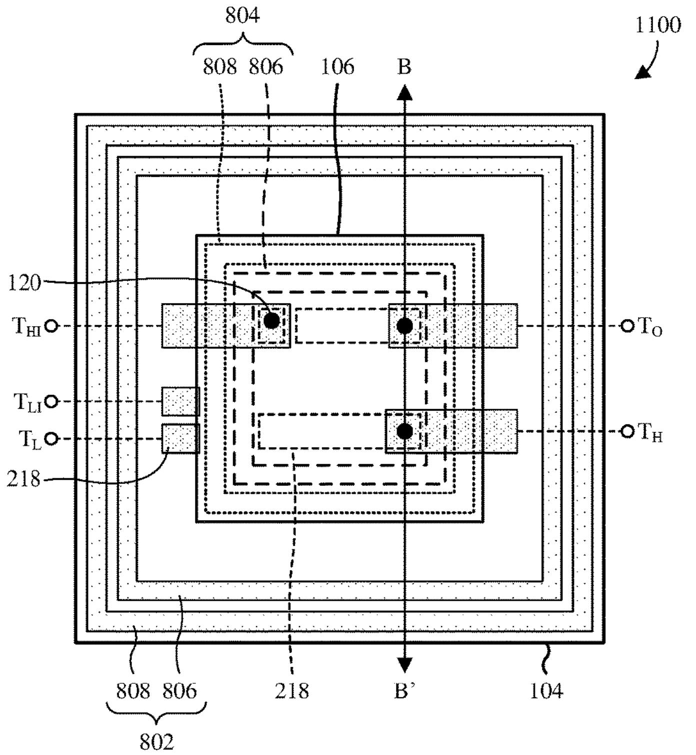

With reference to FIG. 11, a top layout view 1100 of some embodiments of the 3D semiconductor structure of FIG. 10 is provided. The top layout view 1100 is taken at an interface between the bumps 120 and the first interconnect structure 110 to illustrate wires 218 of the first interconnect structure 110 serving as pads. Further, the top layout view 1100 illustrates the wires 218 of the second interconnect structure 116 at the bumps 120 in phantom. The cross-sectional view 1000 of FIG. 10 may, for example, be taken along line B-B' in FIG. 11.

Figure 12:
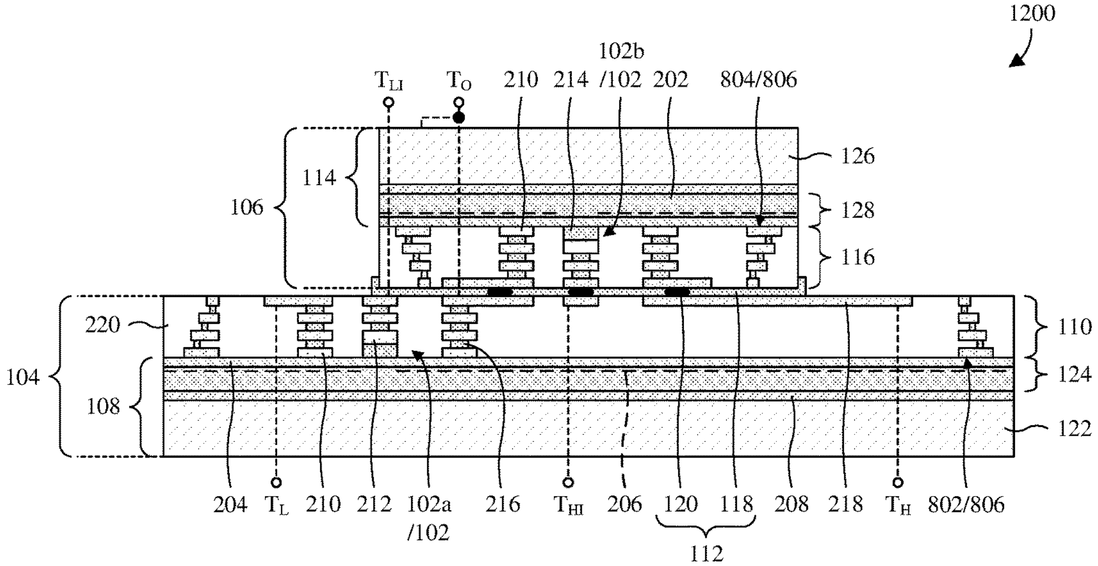
FIG. 12 illustrates a cross-sectional view of some alternative embodiments of the 3D semiconductor structure of FIG. 8 in which through semiconductor vias are omitted.

With reference to FIG. 12, a cross-sectional view 1200 of some alternative embodiments of the 3D semiconductor structure of FIG. 8 is provided in which the through semiconductor vias 808 are omitted.

Figure 13:
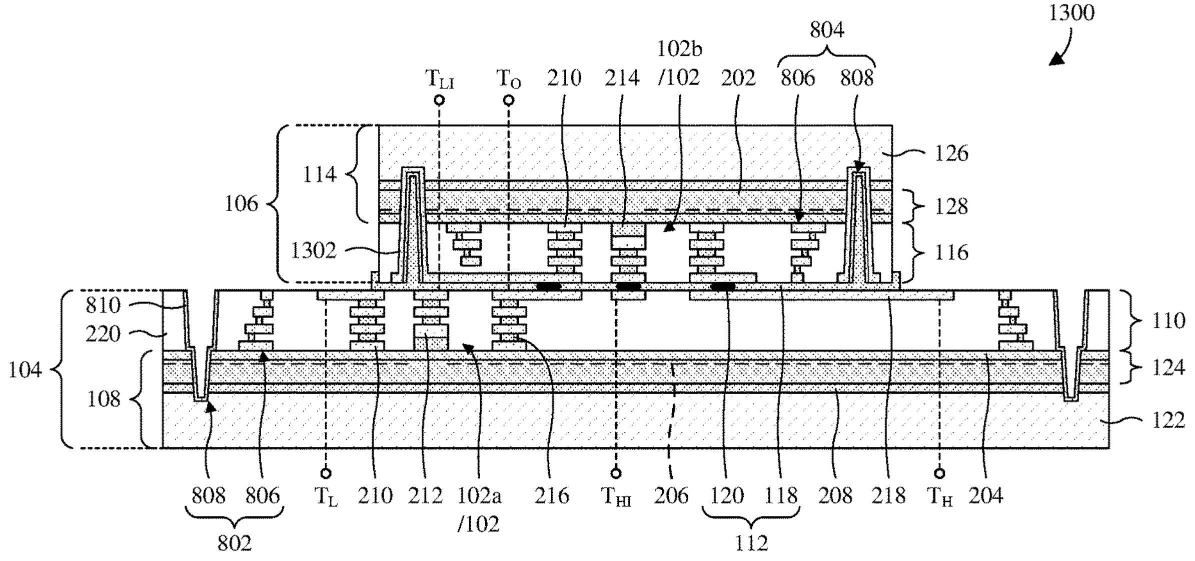
FIG. 13 illustrates a cross-sectional view of some alternative embodiments of the 3D semiconductor structure of FIG. 8 in which a through semiconductor via of a second seal ring comprises metal.

With reference to FIG. 13, a cross-sectional view 1300 of some alternative embodiments of the 3D semiconductor structure of FIG. 8 is provided in which the through semiconductor via 808 of the second seal ring 804 shares a continuous conductive layer 1302 with a wire of the second interconnect structure 116. Further, the via liner 810 of the second seal ring 804 covers and/or lines the continuous conductive layer 1302 at the through semiconductor via 808 of the second seal ring 804. The continuous conductive layer 1302 may, for example, be or comprise metal or the like.

The wire formed by the continuous conductive layer 1302 is electrically coupled to the output terminal $T_O$, whereby the through semiconductor via 808 of the second seal ring 804 is electrically coupled to the output terminal $T_O$. Further, the through semiconductor via 808 of the second seal ring 804 extends to the second carrier substrate 126, whereby the second carrier substrate 126 is also electrically coupled to the output terminal $T_O$. As noted above, such electrical coupling may mitigate a back-gating effect that would otherwise occur if the second carrier substrate 126 was biased with the same bias voltage as the first carrier substrate 122. Further, as seen hereafter, using the through semiconductor via 808 of the second seal ring 804 to electrically couple the second carrier substrate 126 to the output terminal $T_O$ may save a wire bond that would otherwise provide such electrical coupling.

While the through semiconductor via 808 of the second seal ring 804 and a wire of the second interconnect structure 116 are described as sharing the continuous conductive layer 1302, separate conductive layers are amenable in alternative embodiments. Further, while the via liner 810 of the second seal ring 804 and the interconnect dielectric layer 220 of the second interconnect structure 116 are described as separate, the via liner 810 of the second seal ring 804 may be part of the interconnect dielectric layer 220 of the second interconnect structure 116 in alternative embodiments.

Figure 14:
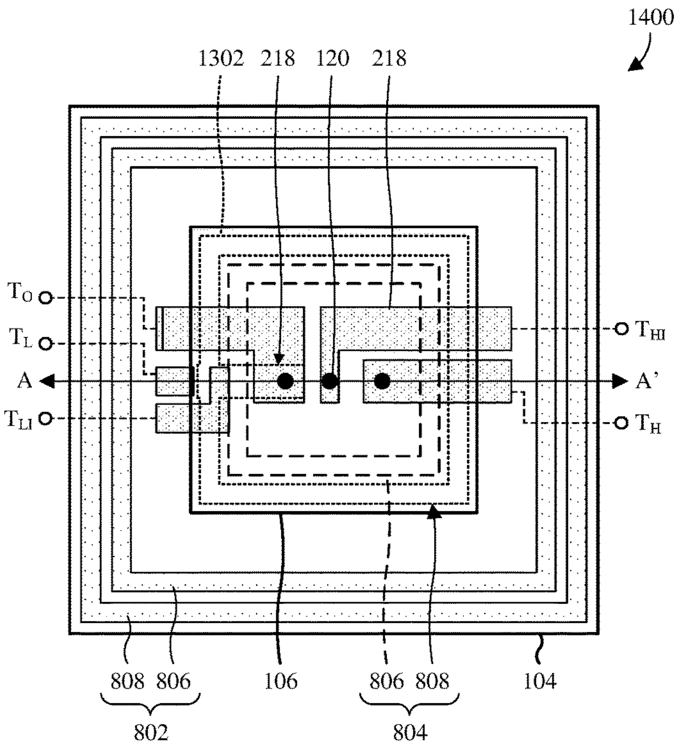
FIG. 14 illustrates a top layout view of some embodiments of the 3D semiconductor structure of FIG. 13.

With reference to FIG. 14, a top layout view 1400 of some embodiments of the 3D semiconductor structure of FIG. 13 is provided. The top layout view 1400 is taken at an interface between the bumps 120 and the first interconnect structure 110 to illustrate wires 218 of the first interconnect structure 110 serving as pads. Further, the continuous conductive layer 1302 forming the through semiconductor via 808 of the second seal ring 804 is shown in phantom. The cross-sectional view 1300 of FIG. 13 may, for example, be taken along line A-A' in FIG. 14.

Figure 15:
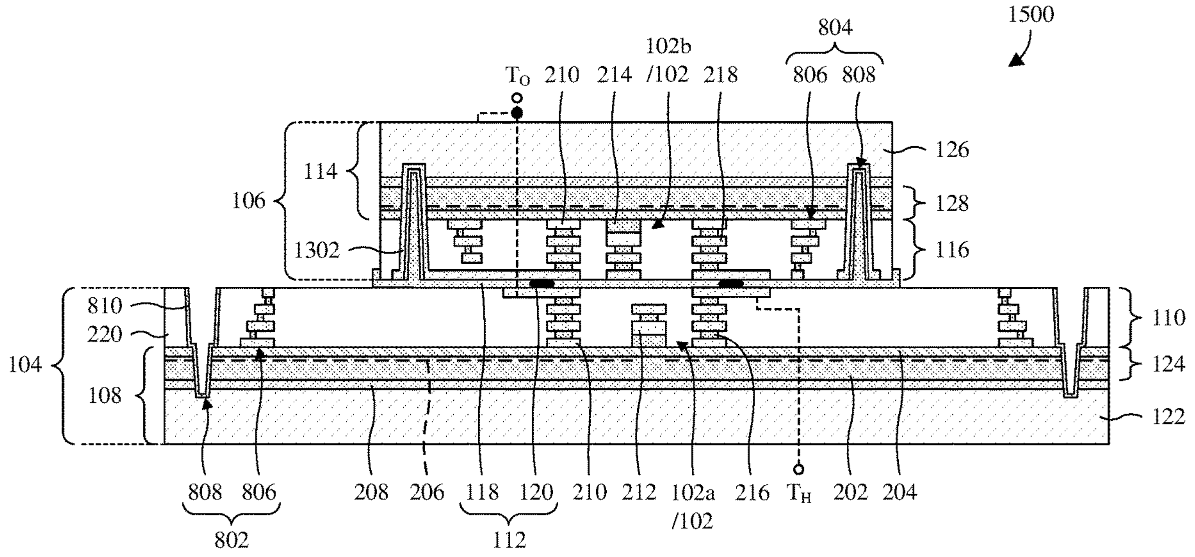
FIGS. 15 and 16 respectively illustrate a cross-sectional view and a top layout view of some alternative embodiments of the 3D semiconductor structure of FIG. 13 in which a first semiconductor device is centered.

With reference to FIG. 15, a cross-sectional view 1500 of some alternative embodiments of the 3D semiconductor structure of FIG. 13 is provided in which the first semiconductor device 102*a* is at a center of the first IC die 104. As a result, the first and second semiconductor devices 102*a*, 102*b* are aligned and the wires 218 and the vias 216 have a different layout.

Figure 16:
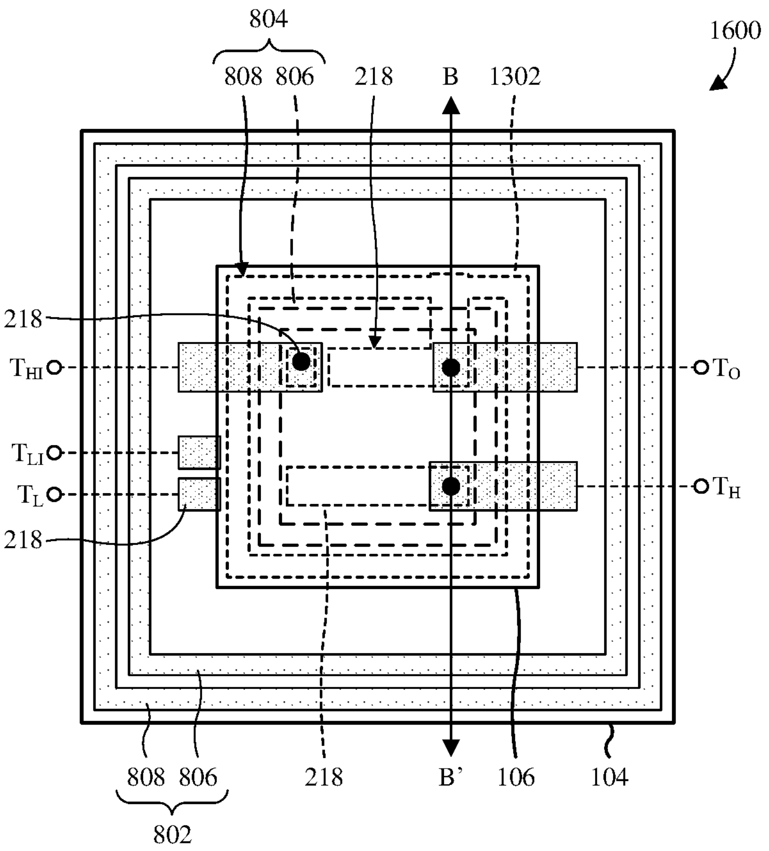

With reference to FIG. 16, a top layout view 1600 of some embodiments of the 3D semiconductor structure of FIG. 15 is provided. The top layout view 1600 is taken at an interface between the bumps 120 and the first interconnect structure 110 to illustrate wires 218 of the first interconnect structure 110 serving as pads. Further, the top layout view 1600 illustrates the wires 218 of the second interconnect structure 116 at the bumps 120 in phantom. The cross-sectional view 1500 of FIG. 15 may, for example, be taken along line B-B' in FIG. 16.

Figure 17:
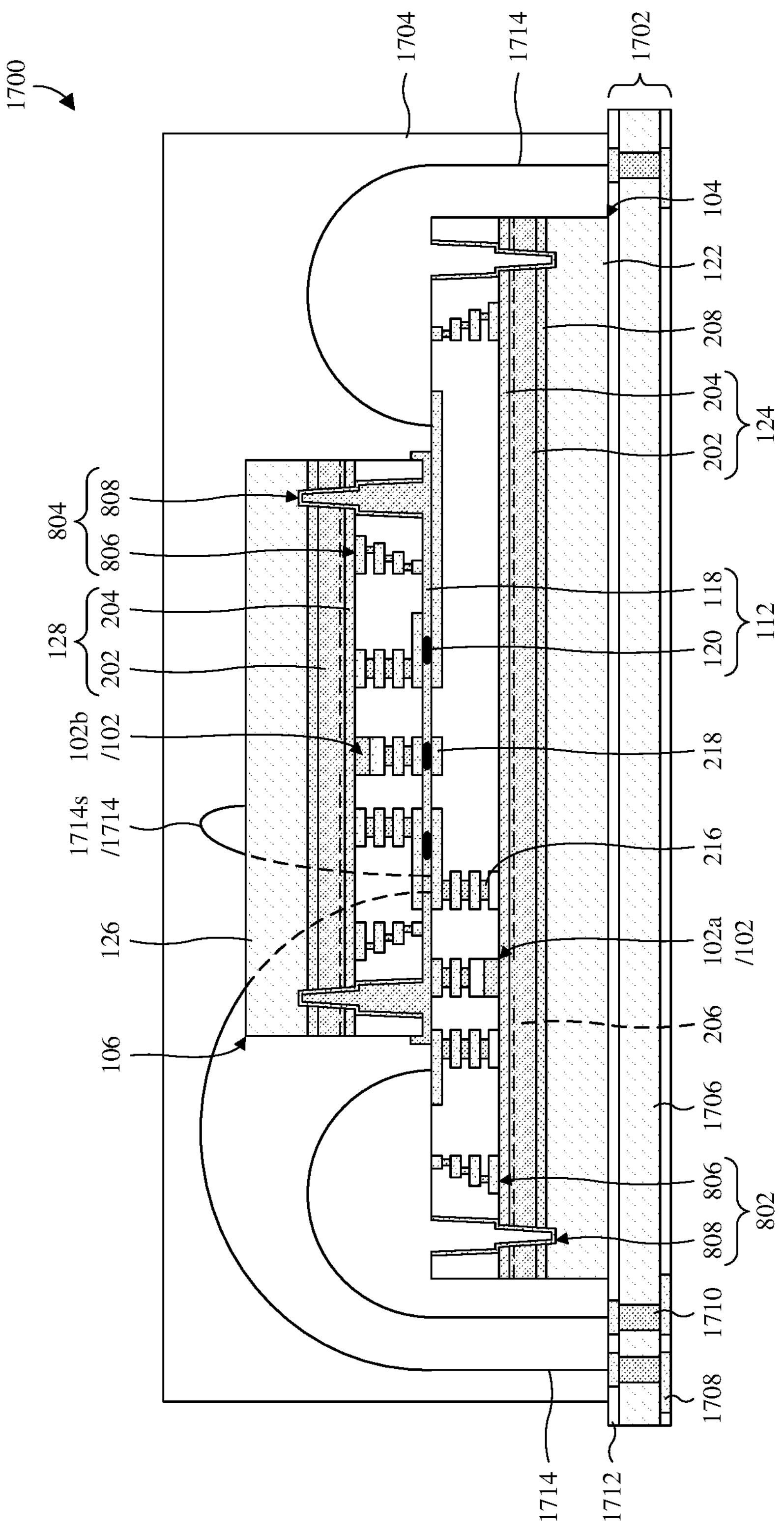
FIG. 17 illustrates a cross-sectional view of some embodiments of the 3D semiconductor structure of FIG. 8 in which IC dies overlie and are bonded to an interposer die.

With reference to FIG. 17, a cross-sectional view 1700 of some embodiments of the 3D semiconductor structure of FIG. 8 is provide in which the first and second IC dies 104, 106 overlie and are bonded to an interposer die 1702 (or interposer 1702 for short). In some embodiments, an adhesive bonds the first IC die 104 to the interposer die 1702. Further, the first and second IC dies 104, 106 are surrounded by a molding compound 1704.

The interposer die 1702 comprises an interposer substrate 1706, a plurality of interconnect features 1708, and a plurality of through substrate vias 1710. The interconnect features 1708 respectively overlie and underlie the interposer substrate 1706 within corresponding interconnect dielectric layers 1712. The through substrate vias 1710 extend through the interposer substrate 1706, respectively from the interconnect features 1708 overlying interposer substrate 1706 respectively to interconnect features 1708 underlying the interposer substrate 1706. While only one level of interconnect features 1708 is shown overlying the interposer substrate 1706, more levels of interconnect features are amenable. Similarly, while only one level of interconnect features 1708 is shown underlying the interposer substrate 1706, more levels of interconnect features are amenable.

The interconnect features 1708 are conductive and may, for example, be or comprise metal and/or some other suitable conductive material(s). Further, the interconnect features 1708 may, for example, be or comprise wires, vias, pads, the like, or any combination of the foregoing. In some embodiments in which multiple levels of interconnect features overlie or underlie the interposer substrate 1706, the levels alternate between via levels and wire levels similar to the wires 218 and the vias 216. The through substrate vias 1710 are conductive and may, for example, be or comprise metal and/or some other suitable conductive material(s). Further, while not shown, dielectric layers may separate the through substrate vias 1710 from the interposer substrate 1706. The interposer substrate 1706 may, for example, be or comprise a bulk silicon substrate and/or some other suitable substrate.

A plurality of wire bonds 1714 is in the molding compound 1704. A substrate wire bond 1714*s* of the wire bonds 1714 extends to the second carrier substrate 126 from a pad at an output of the half-bridge circuit formed by the first and second semiconductor devices 102*a*, 102*b*. As noted above, this may mitigate the back-gating effect. A remainder of the wire bonds 1714 extend respectively from the interposer die 1702 respectively to the pads of the half-bridge circuit. As noted above, the pads correspond to wires 218 at an interface between the bumps 120 and the first interconnect structure 110. Solid portions of the wire bonds 1714 are in the cross-sectional view 1700 of FIG. 17, and dashed portions of the wire bonds 1714 are outside the cross-sectional view 1700 of FIG. 17 and do not extend through the second IC die 106.

Figure 18:
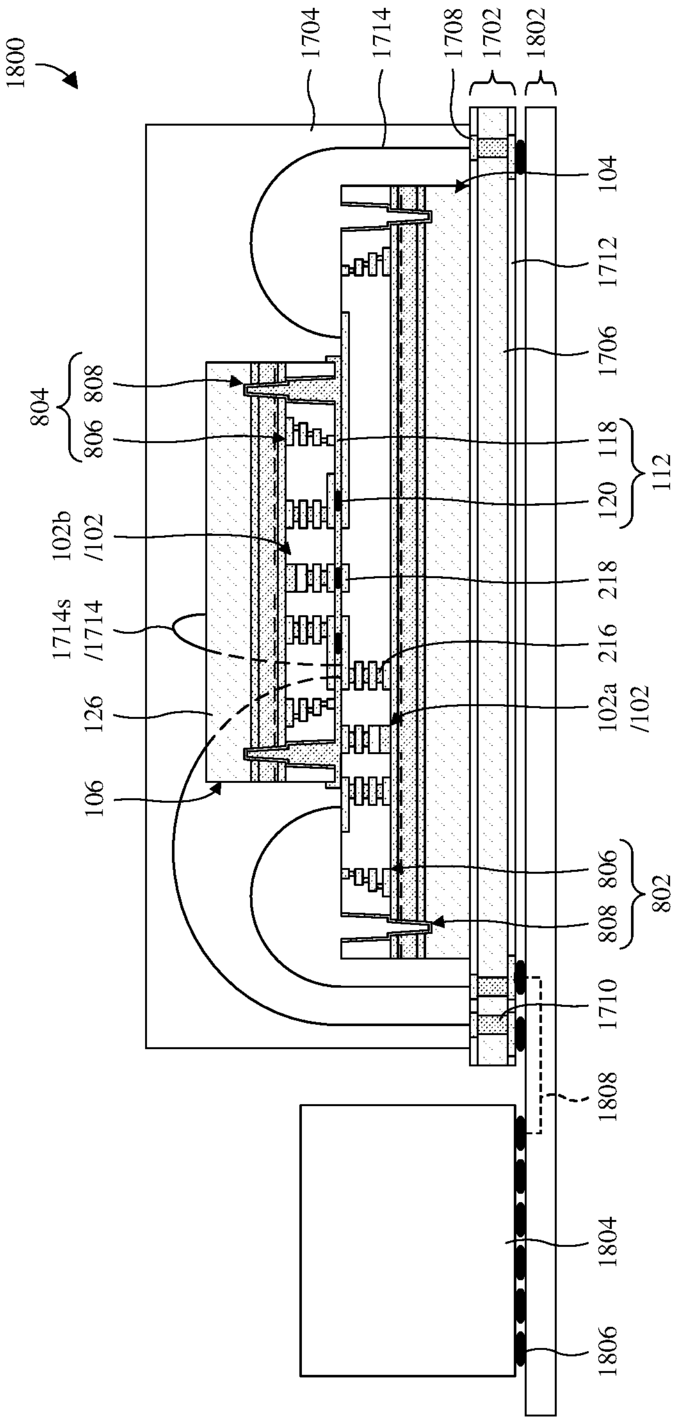
FIG. 18 illustrates a cross-sectional view of some embodiments of the 3D semiconductor structure of FIG. 17 in which the interposer die overlies and is bonded to a second interposer die.

With reference to FIG. 18, a cross-sectional view 1800 of some embodiments of the 3D semiconductor structure of FIG. 17 is provide in which the interposer die 1702 overlies and is bonded to a second interposer die 1802 (or a second interposer 1802 for short). Further, a third IC die 1804 overlies and is bonded to the second interposer die 1802. The third IC die 1804 and the interposer die 1702 are bonded to the second interposer die 1802 by second bumps 1806. The second bumps 1806 are conductive and also electrically couple the third IC die 1804 and the interposer die 1702 to the second interposer die 1802.

The second interposer die 1802 comprises a plurality of conductive features (not shown), which form conductive paths 1808 (only one of which is shown) electrically coupling the third IC die 1804 to the first IC die 104 and/or the second IC die 106. The conductive features may, for example, include wires, vias, pads, and so on. The third IC die 1804 may, for example, be or comprise an input/output circuit, a gate driver circuit, an electrostatic discharge (ESD) circuit, some other suitable circuit, or any combination of the foregoing. The ESD circuit may, for example, protect the first and second semiconductor devices 102*a*, 102*b* from ESD events. The gate driver circuit may, for example, provide a signal to a gate electrode of the first semiconductor device 102*a* and/or a signal to a gate electrode of the second semiconductor device 102*b*. The I/O circuit may, for example, receive an output of the half-bridge circuit formed by the first and second semiconductor devices.

While FIGS. 17 and 18 illustrate the first and second IC dies 104, 106 configured in accordance with the embodiments of FIG. 8, the first and second IC dies 104, 106 may alternatively be configured in accordance with the embodiments in any of FIGS. 1, 2, 6, 10, 12, 13, and 15. In alternative embodiments in which the first and second IC dies 104, 106 are configured in accordance with the embodiments of FIG. 13 or 15, the substrate wire bond 1714*s* may be omitted. The through semiconductor via 808 of the second IC die 106 provides the electrical coupling the substrate wire bond 1714*s* would otherwise provide.

With reference to FIGS. 19-29, a series of cross-sectional views 1900-2900 of some embodiments of a method for forming a 3D semiconductor structure for wide-bandgap semiconductor devices is provided. The method may, for example, be employed to form the 3D semiconductor structure of FIG. 18 or some other suitable semiconductor structure.

Figure 19:
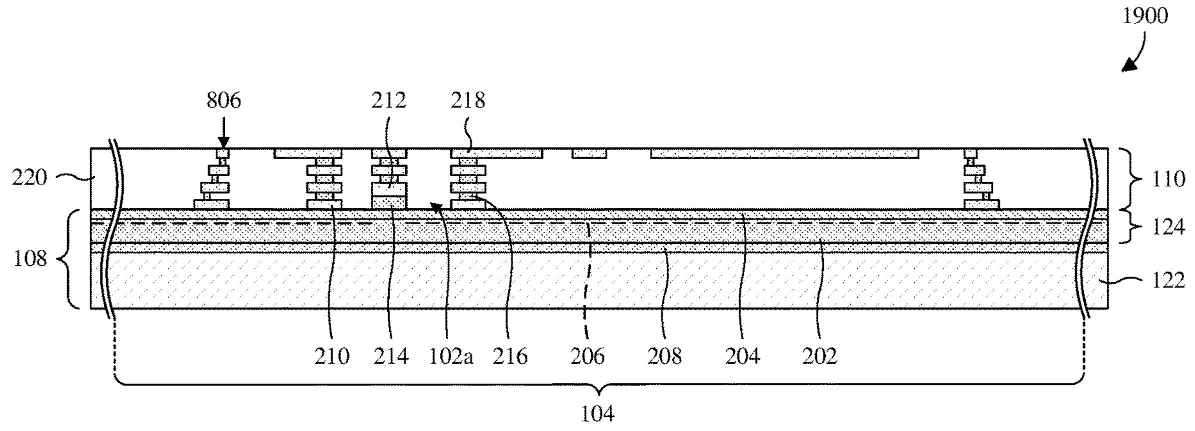
FIGS. 19-29 illustrate a series of cross-sectional views of some embodiments of a method for forming a 3D semiconductor structure for wide-bandgap semiconductor devices.

As illustrated by the cross-sectional view 1900 of FIG. 19, a first IC die 104 is formed repeating across a first substrate 108, which is a wafer. Note that only one instance of the first IC die 104 is illustrated. The first substrate 108 comprises a first carrier substrate 122, a buffer layer 208, and a first semiconductor layer 124. The buffer layer 208 overlies the first carrier substrate 122, and the first semiconductor layer 124 overlies the buffer layer 208.

The first semiconductor layer 124 comprises a channel layer 202 and a barrier layer 204. The channel layer 202 and the barrier layer 204 directly contact at a heterojunction and are semiconductor layers having different bandgaps. Further, the channel layer 202 accommodate a 2D carrier gas 206. In some embodiments, the channel layer 202 is or comprises GaN, and the barrier layer 204 is or comprises AlGaN, or vice versa. In alternative embodiments, the channel layer 202 is or comprises some other suitable wide-bandgap material and/or the barrier layer 204 is or comprises some other suitable wide-bandgap material. A wide-bandgap material may, for example, be a semiconductor material having a band gap greater than a bandgap of silicon or the like and/or having a band gap greater than about 2 eV or some other suitable value.

A first interconnect structure 110 overlies the first substrate 108. The first interconnect structure 110 comprises a plurality of vias 216 and a plurality of wires 218 stacked in an interconnect dielectric layer 220. The vias 216 are grouped into a plurality of via levels, and the wires 218 are grouped into a plurality of wire levels. The wire and via levels are alternatingly stacked. Further, wires at a top wire level may also be regarded as pads and may, for example, have a top layout as in FIG. 9.

The first IC die 104 comprises a conductive wall 806 and a first semiconductor device 102*a*. The conductive wall 806 is formed by the wires 218 and the vias 216 and extends laterally in a closed path along a periphery of the first IC die 104. The conductive wall 806 may, for example, have a top layout as shown for its counterpart in FIG. 9. The first semiconductor device 102*a* is between the first substrate 108 and the first interconnect structure 110, and comprises a pair of source/drain electrodes 210, a gate electrode 212, and a cap layer 214. The gate electrode 212 is between the source/drain electrodes 210, and the cap layer 214 separates the gate electrode 212 from the first semiconductor layer 124.

Figure 20:
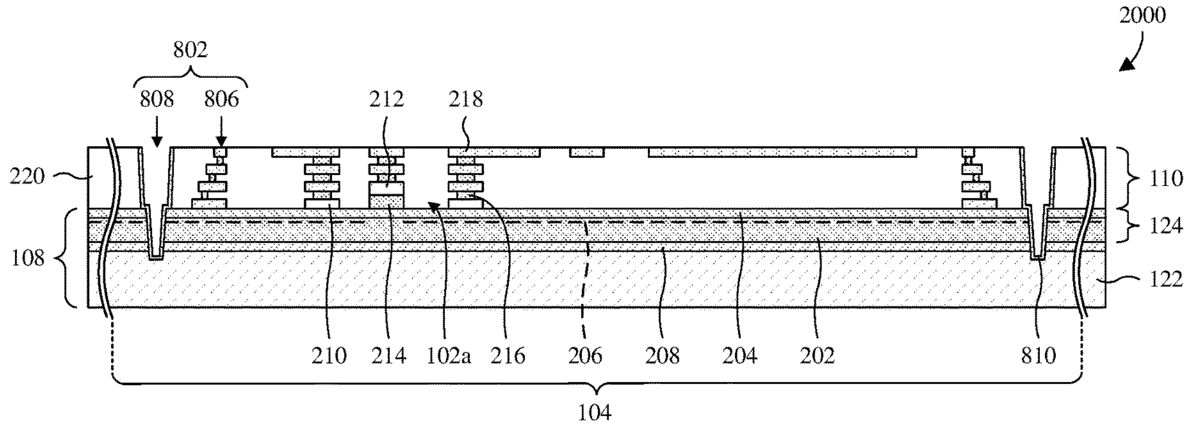

As illustrated by the cross-sectional view 2000 of FIG. 20, a through semiconductor via 808 is formed at the first IC die 104. The through semiconductor via 808 corresponds to a trench lined by a via liner 810, and extends vertically through the first interconnect structure 110 and the first semiconductor layer 124 to the first carrier substrate 122. Further, the through semiconductor via 808 extends laterally in a closed path along a periphery of the first IC die 104 to surround the conductive wall 806. The through semiconductor via 808 may, for example, have a top layout as shown for its counterpart in FIG. 9.

Collectively, the through semiconductor via 808 and the conductive wall 806 form a first seal ring 802. The first seal ring 802 may provide stress relief and reduce the likelihood of cracking while separating instances of the first IC die 104 from each other. Such separating may, for example, be performed by a die saw or the like.

Figure 21:
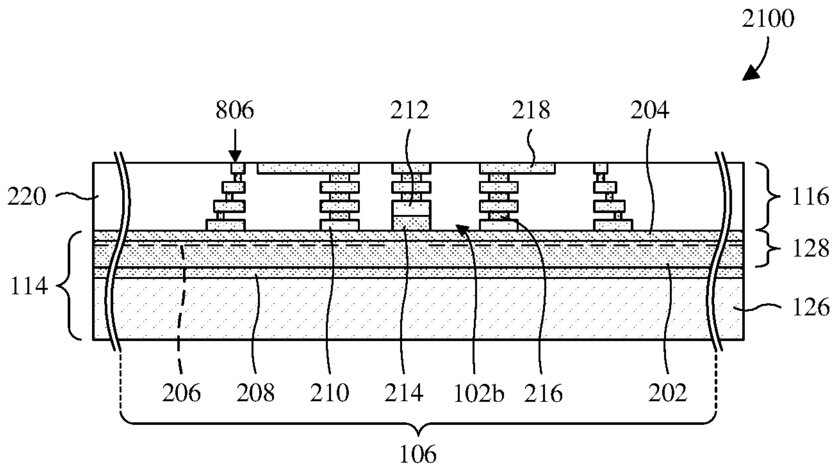

As illustrated by the cross-sectional view 2100 of FIG. 21, a second IC die 106 is formed repeating across a second substrate 114, which is a wafer. Note that only one instance of the second IC die 106 is illustrated. The second substrate 114 comprises a second carrier substrate 126, a buffer layer 208, and a second semiconductor layer 128. The second semiconductor layer 128 overlies the second carrier substrate 126, and is as the first semiconductor layer 124 is described with regard to FIG. 19. As such, the second semiconductor layer 128 comprises a channel layer 202 and a barrier layer 204, and the channel layer 202 accommodates a 2D carrier gas 206. The buffer layer 208 separates second semiconductor layer 128 from the second carrier substrate 126

A second interconnect structure 116 overlies the second substrate 114, and is as the first interconnect structure 110 is described with regard to FIG. 19. As such, the second interconnect structure 116 comprises a plurality of vias 216 and a plurality of wires 218 stacked in an interconnect dielectric layer 220.

The second IC die 106 comprises a conductive wall 806 and a second semiconductor device 102*b*. The conductive wall 806 is formed by the wires 218 and the vias 216, and extends laterally in a closed path along a periphery of the second IC die 106. The conductive wall 806 may, for example, have a top layout as shown for its counterpart in FIG. 9. The second semiconductor device 102*b* is between the second interconnect structure 116 and the second substrate 114, and is as the first semiconductor device 102*a* is described with regard to FIG. 19. As such, the second semiconductor device 102*b* comprises a pair of source/drain electrodes 210, a gate electrode 212, and a cap layer 214.

Figure 22:
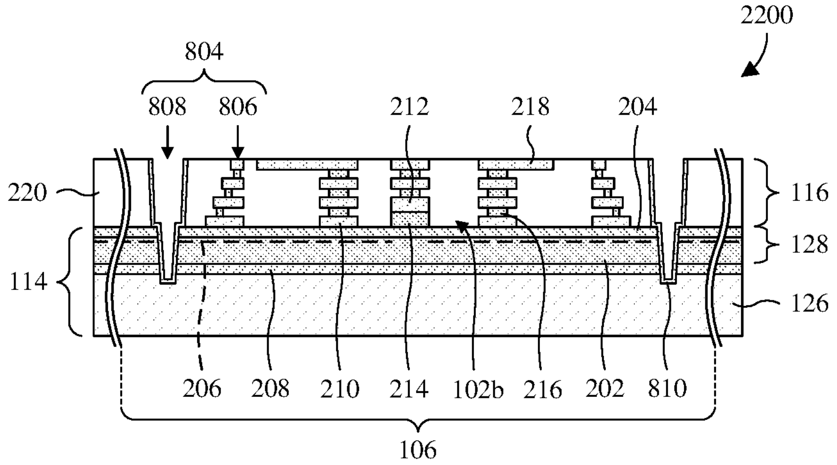

As illustrated by the cross-sectional view 2200 of FIG. 22, a through semiconductor via 808 is formed at the second IC die 106. The through semiconductor via 808 is as described with regard to FIG. 20 and hence corresponds to a trench lined by a via liner 810. The through semiconductor via 808 extends vertically through the second interconnect structure 116 and the second semiconductor layer 128 to the second carrier substrate 126. Further, the through semiconductor via 808 extends laterally in a closed path along a periphery of the second IC die 106 to surround the conductive wall 806. The through semiconductor via 808 may, for example, have a top layout as shown for its counterpart in FIG. 9.

Collectively, the through semiconductor via 808 and the conductive wall 806 form a second seal ring 804. The second seal ring 804 may provide stress relief and reduce the likelihood of cracking while separating instances of the second IC die 106 from each other. Such separating may, for example, be performed by a die saw or the like.

Figure 23:
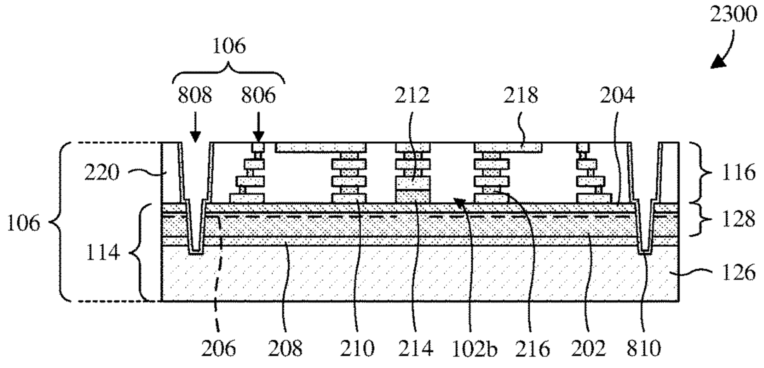

As illustrated by the cross-sectional view 2300 of FIG. 23, a singulation process is performed to separate instances of the second IC die 106 from each other. The singulation process comprises cutting the semiconductor structure of FIG. 22 along scribe lines between instances of the second IC die 106 using a die saw. During the cutting, the second seal ring 804 protects an interior of the second IC die 106 from cracking.

Figure 24:
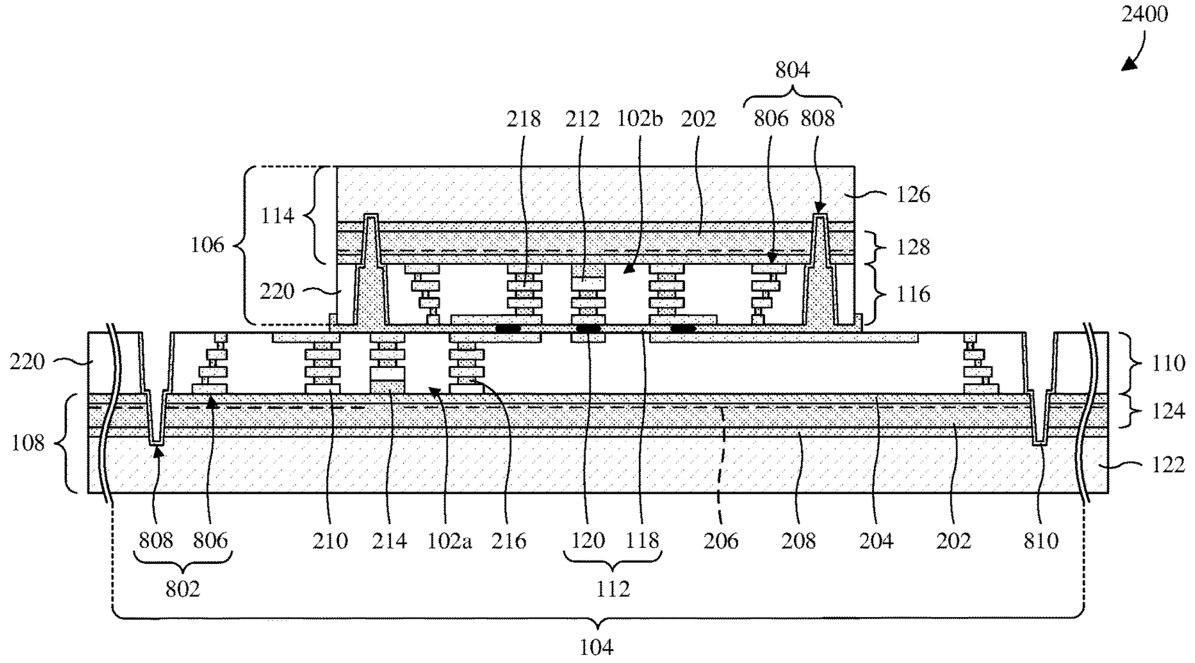

As illustrated by the cross-sectional view 2400 of FIG. 24, the second IC die 106 is vertically flipped, and is arranged over and bonded to the first IC die 104 of FIG. 20. The bonding is achieved with a bond structure 112, which comprises an adhesive layer 118 and a plurality of bumps 120. The adhesive layer 118 is dielectric, whereas the bumps 120 are conductive. The bumps 120 are embedded in the adhesive layer 118 and electrically couple the second IC die 106 to the first IC die 104. The adhesive layer 118 and the bumps 120 physically secure the second IC die 106 to the first IC die 104.

Because the first IC die 1902 has yet to undergo a singulation process, instances of the first IC die 104 remain connected and the first substrate 108 corresponds to a wafer. As such, the method being performed may be characterized as a CoW manufacturing process. In alternative embodiments, the first IC die 104 undergoes singulation concurrently with second IC die 106, whereby the method being performed may be characterized as a WoW manufacturing process.

In some embodiments, the bumps 120 and the first and second interconnect structures 110, 116 electrically couple the first and second semiconductor devices 102*a*, 102*b* together to form a half-bridge circuit in which the first and second semiconductor devices 102*a*, 102*b* correspond to a low-side transistor and a high-side transistor or vice versa. Because the high-side and low-side transistors are on separate substrates (e.g., the first and second substrates 108, 114), the substrates may have different bias voltages to mitigate the back-gating effect. Because electrical coupling between the high-side and low-side transistors is through the bond structure 112, wire bonding between the high-side and low-side transistors is avoided and conductive paths between the high-side and low-side transistors are short. As such, parasitic inductance and ringing low. Collectively, the foregoing may lead to high performance.

Because the high-side and low-side transistors are vertically stacked, area occupied by the half-bridge circuit is small. Because the half-bridge circuit may be formed by a CoW manufacturing processes, WoW manufacturing process, or the like. Such manufacturing processes simplify manufacture of the half-bridge circuit. Collectively, the foregoing may lead to low cost and high manufacturing yields.

Figure 25:
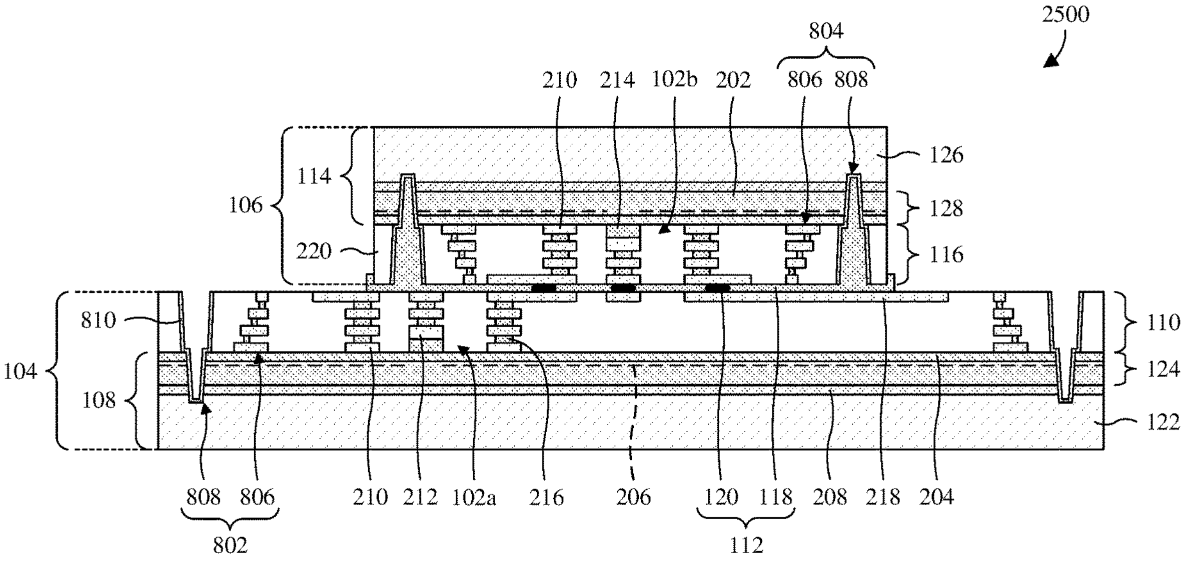

As illustrated by the cross-sectional view 2500 of FIG. 25, a singulation process is performed to separate instances of the first IC die 104 from each other. The singulation process comprises cutting the semiconductor structure of FIG. 24 along scribe lines between instances of the first IC die 104 using a die saw. During the cutting, the first seal ring 802 protects an interior of the first IC die 104 from cracking.

Figure 26:
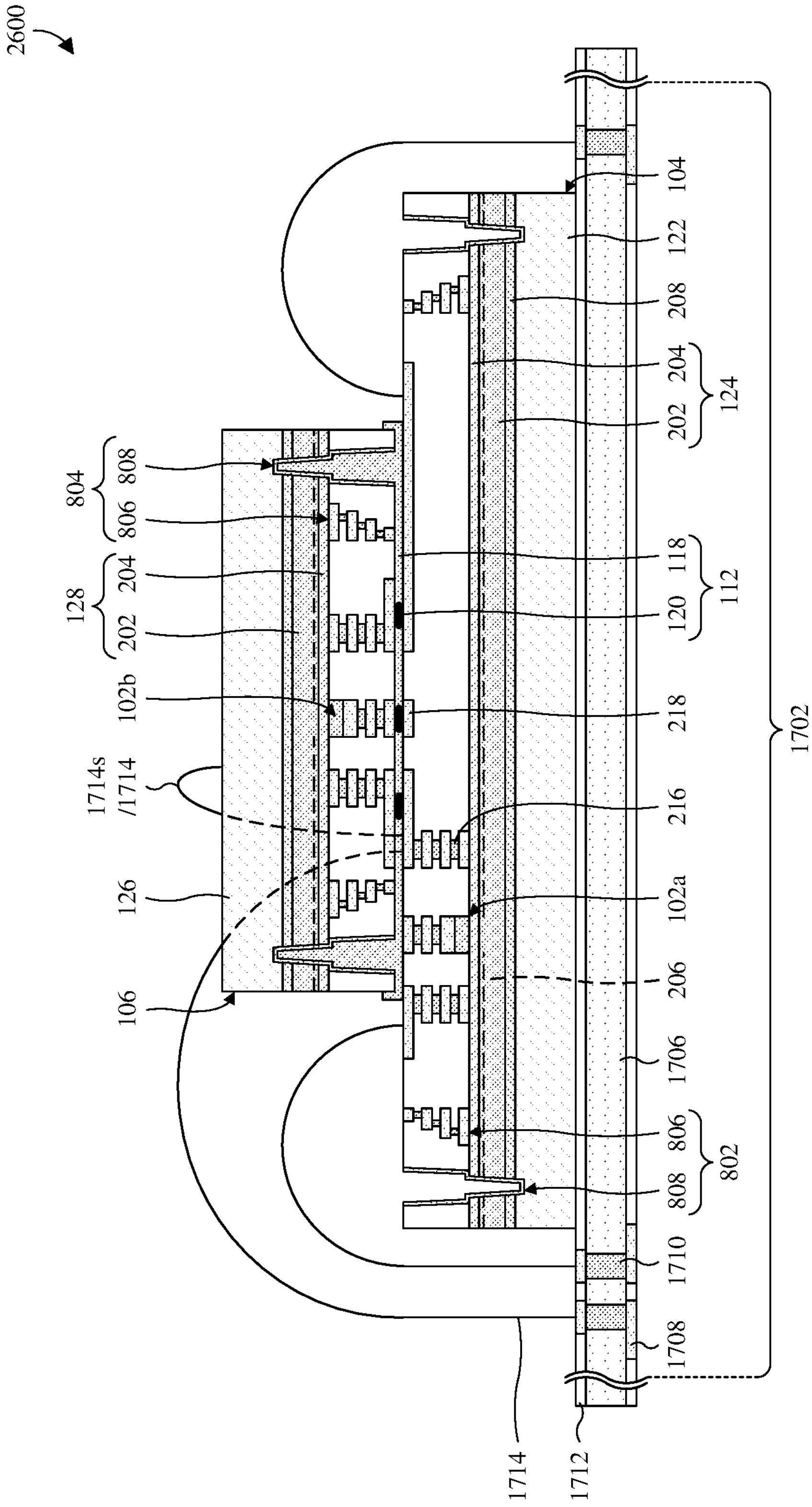

As illustrated by the cross-sectional view 2600 of FIG. 26, the first and second IC dies 104, 106 are arranged over and bonded to an interposer die 1702 (or interposer 1702 for short). In some embodiments, an adhesive bonds the first IC die 104 to the interposer die 1702.

The interposer die 1702 repeats across an interposer substrate 1706, which is a wafer. Note that only one instance of the interposer die 1702 is illustrated. Further, the interposer die 1702 comprises a plurality of interconnect features 1708 and a plurality of through substrate vias 1710. The interconnect features 1708 respectively overlie and underlie the interposer substrate 1706 within corresponding interconnect dielectric layers 1712. The through substrate vias 1710 extend through the interposer substrate 1706, respectively from the interconnect features 1708 overlying interposer substrate 1706 respectively to interconnect features 1708 underlying the interposer substrate 1706. The interconnect features 1708 may, for example, be wires, vias, pads, the like, or any combination of the foregoing.

Also illustrated by the cross-sectional view 2600 of FIG. 26, a plurality of wire bonds 1714 is formed. A substrate wire bond **1714*s* of the wire bonds 1714 extends to the second carrier substrate 126 from a pad at an output of the half-bridge circuit formed by the first and second semiconductor devices 102*a*, 102*b*. As noted above, this may mitigate the back-gating effect. Further, a remainder of the wire bonds 1714 extend respectively from the interposer die 1702 respectively to the pads of the half-bridge circuit. Note that the pads correspond to wires 218 at an interface between the bumps 120 and the first interconnect structure 110**.

Figure 27:
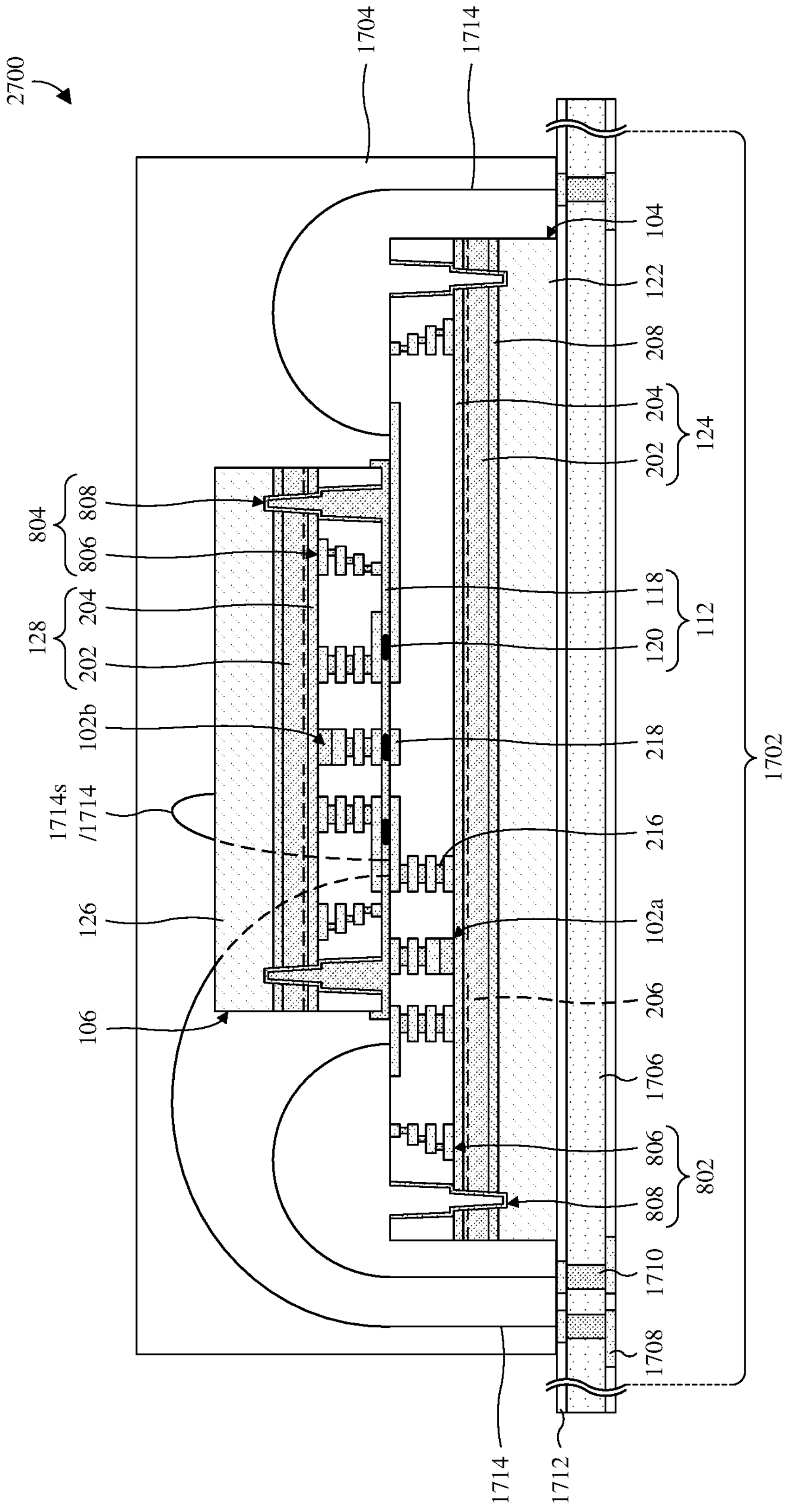

As illustrated by the cross-sectional view 2700 of FIG. 27, a molding compound 1704 is formed surrounding the first and second IC dies 104, 106. In some embodiments, the molding compound 1704 is deposited blanketing the interposer substrate 1706 and is then patterned to clear the molding compound 1704 from scribe lines separating instances of the interposer die 1702 on the interposer substrate 1706. The patterning may, for example, be performed by a photolithography/etching process or some other suitable patterning process.

Figure 28:
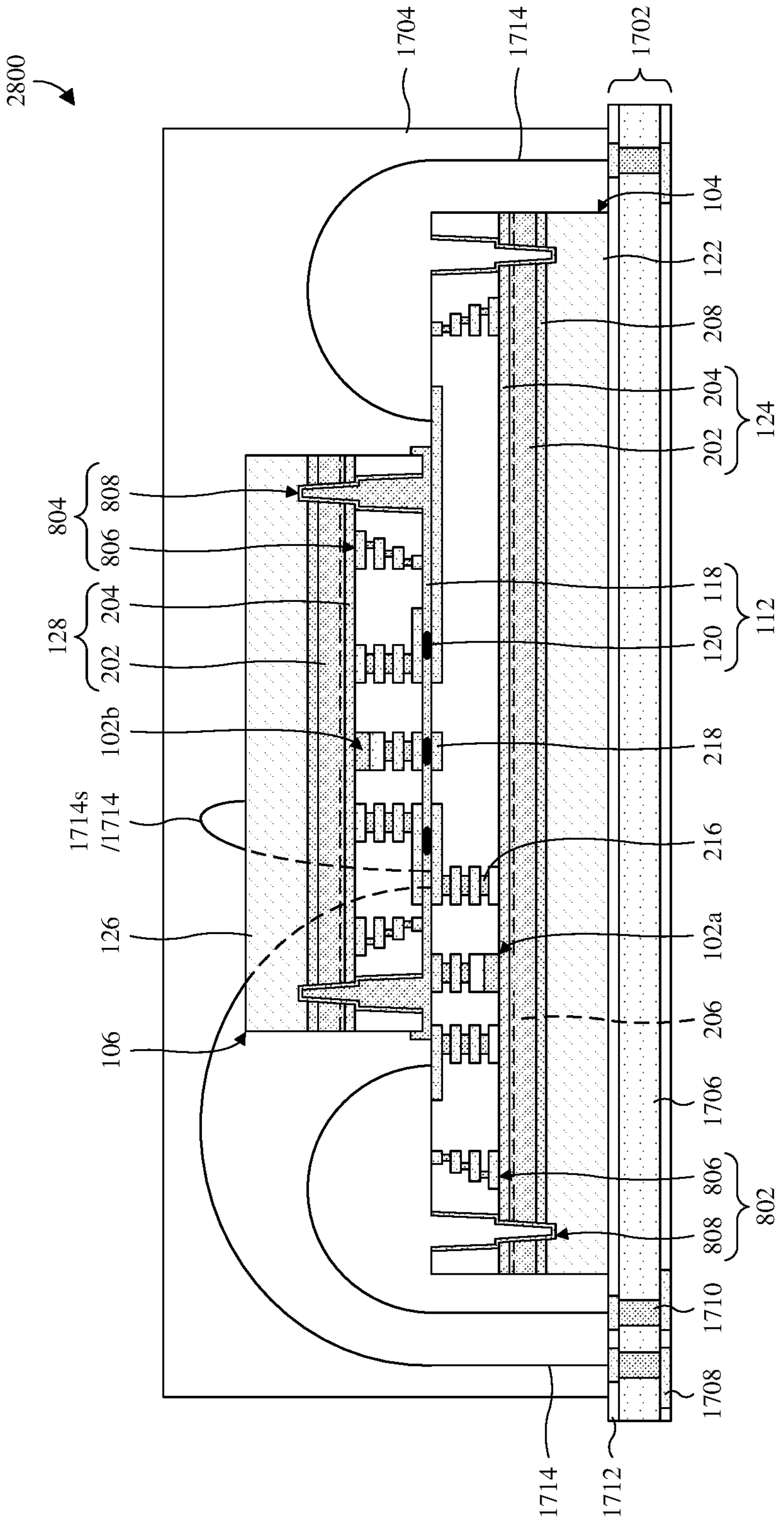

As illustrated by the cross-sectional view 2800 of FIG. 28, a singulation process is performed to separate instances of the interposer die 1702 from each other. The singulation process comprises cutting the semiconductor structure of FIG. 27 along scribe lines between instances of the interposer die 1702 using a die saw.

Figure 29:
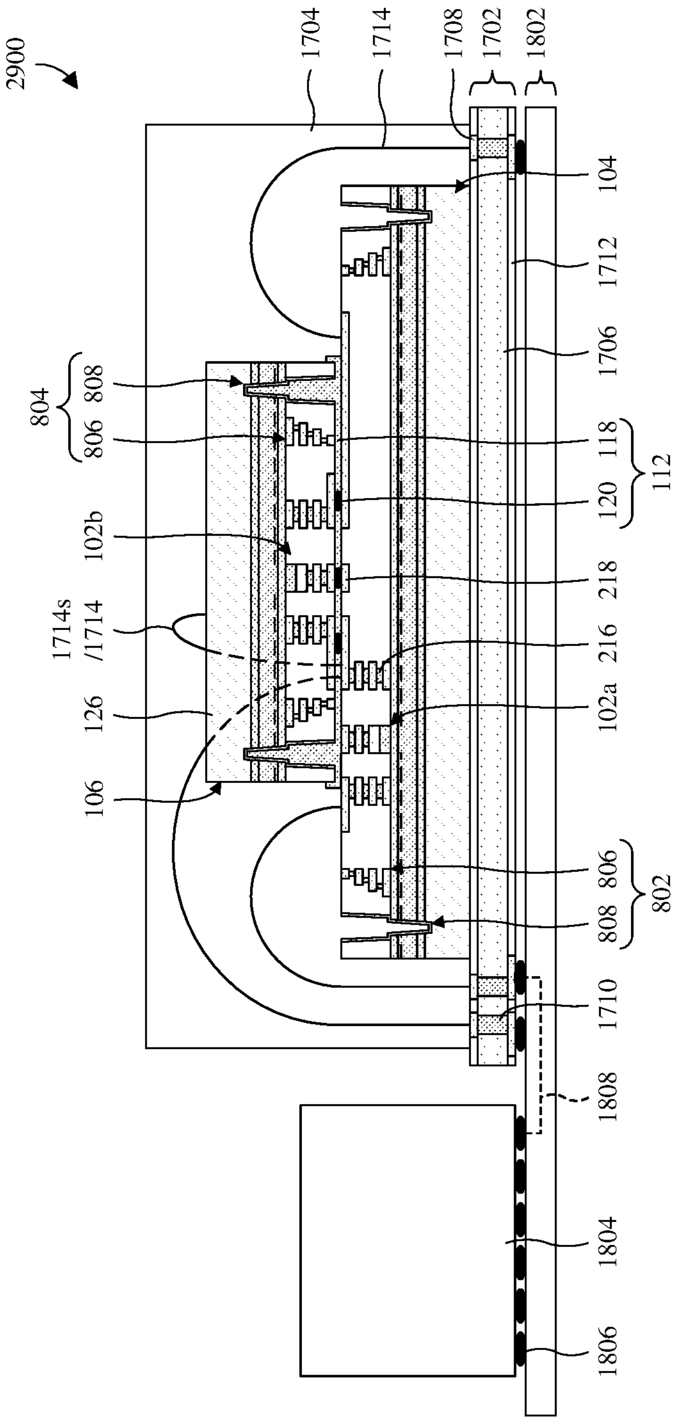

As illustrated by the cross-sectional view 2900 of FIG. 29, the semiconductor structure of FIG. 28 is arranged over and is bonded to a second interposer die 1802 (or second interposer 1802 for short). Further, a third IC die 1804 is arranged over and bonded to the second interposer die 1802. The third IC die 1804 and the interposer die 1702 are bonded to the second interposer die 1802 by second bumps 1806. The second bumps 1806 are conductive and also electrically couple the third IC die 1804 and the interposer die 1702 to the second interposer die 1802.

The second interposer die 1802 comprises a plurality of conductive features (not shown), which form conductive paths 1808 (only one of which is shown) electrically coupling the third IC die 1804 to the first IC die 104 and/or the second IC die 106. The conductive features may, for example, include wires, vias, pads, and so on.

While FIGS. 19-29 are described with reference to a method, it will be appreciated that the structures shown in FIGS. 19-29 are not limited to the method but rather may stand alone separate of the method. While FIGS. 19-29 are described as a series of acts, it will be appreciated that the order of the acts may be altered in other embodiments. While FIGS. 19-29 illustrate and describe as a specific set of acts, some acts that are illustrated and/or described may be omitted in other embodiments. Further, acts that are not illustrated and/or described may be included in other embodiments.

Figure 30:
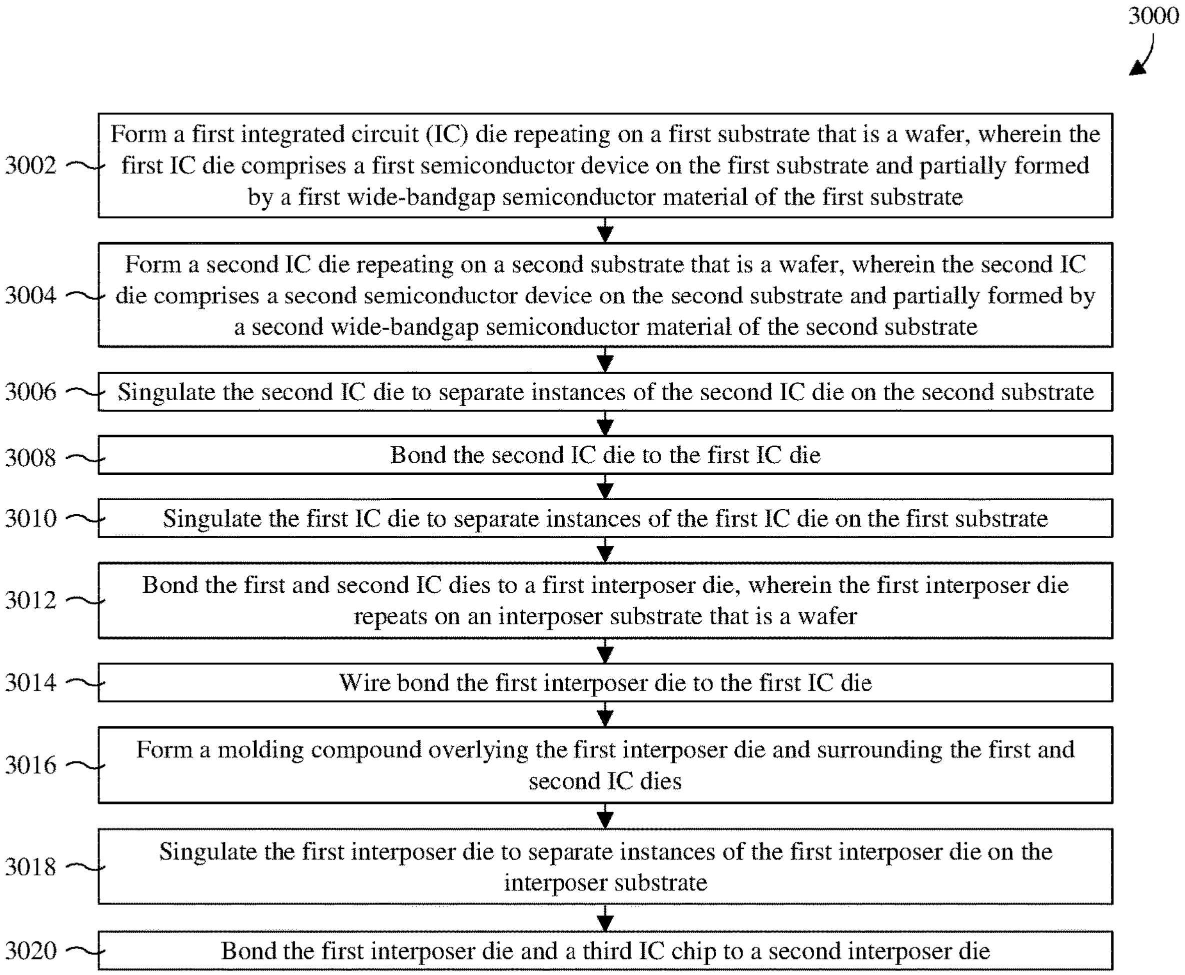
FIG. 30 illustrates a block diagram of some embodiments of the method of FIGS. 19-29.

With reference to FIG. 30, a block diagram 3000 of some embodiments of the method of FIGS. 19-29 is provided.

At 3002, a first IC die is formed repeating on a first substrate that is a wafer, wherein the first IC die comprises a first semiconductor device on the first substrate and partially formed by a first wide-bandgap semiconductor material of the first substrate. See, for example, FIGS. 19 and 20. The first wide-bandgap semiconductor material of the first substrate may, for example, be or comprise GaN or the like.

At 3004, a second IC die is formed repeating on a second substrate that is a wafer, wherein the second IC die comprises a second semiconductor device on the second substrate and partially formed by a second wide-bandgap semiconductor material of the second substrate. See, for example, FIGS. 21 and 22. The second wide-bandgap semiconductor material of the first substrate may, for example, be or comprise GaN or the like.

At 3006, the second IC die is singulated to separate instances of the second IC die on the second substrate. See, for example, FIG. 23.

At 3008, the second IC die is bonded to the first IC die. See, for example, FIG. 24.

At 3010, the first IC die is singulated to separate instances of the first IC die on the first substrate. See, for example, FIG. 25.

At 3012, the first and second IC dies are bonded to a first interposer die, wherein the first interposer die repeats on an interposer substrate that is a wafer. See, for example, FIG. 26.

At 3014, the first interposer die is wire bonded to the first IC die. See, for example, FIG. 26.

At 3016, a molding compound is formed overlying the first interposer die and surrounding the first and second IC dies. See, for example, FIG. 27.

At 3018, the first interposer die is singulated to separate instances of the interposer die on the interposer substrate. See, for example, FIG. 28.

At 3020, the first interposer die and a third IC die are bonded to a second interposer die. See, for example, FIG. 29.

While the block diagram 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 31-34, a series of cross-sectional views 3100-3400 of some alternative embodiments of the method of FIGS. 19-29 is provided in which the through semiconductor via 808 of the second seal ring 804 comprises metal. The method may, for example, be employed to form alternative embodiments of the 3D semiconductor structure of FIG. 18 in which the first and second IC dies 104, 106 are in accordance with the embodiments of FIG. 13 or some other suitable embodiments.

Figure 31:
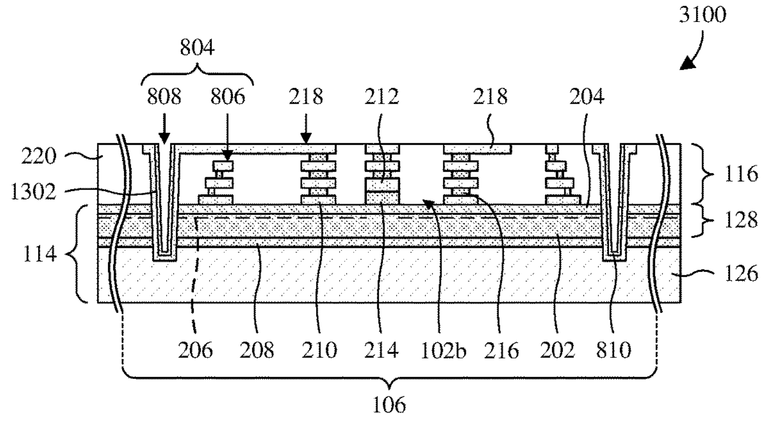
FIGS. 31-34 illustrates a series of cross-sectional views of some alternative embodiments of the method of FIGS. 19-29.

As illustrated by the cross-sectional view 3100 of FIG. 31, a second IC die 106 is formed as described with regard to FIGS. 21 and 22, except that the through semiconductor via 808 of the second seal ring 804 is formed sharing a continuous conductive layer 1302 with a wire of the second interconnect structure 116. Further, the via liner 810 covers and/or lines the continuous conductive layer 1302 at the through semiconductor via 808. As such, a process for forming the through semiconductor via 808 may comprise depositing the continuous conductive layer 1302 lining a trench corresponding to the through semiconductor via 808.

The through semiconductor via 808 extends through the second semiconductor layer 128 to the second carrier substrate 126. As such, the wire formed by the continuous conductive layer 1302 is electrically coupled to the second carrier substrate 126 by the through semiconductor via 808. The continuous conductive layer 1302 may, for example, have a top layout as shown in FIG. 14 and/or may, for example, be or comprise metal or the like.

Figure 32:
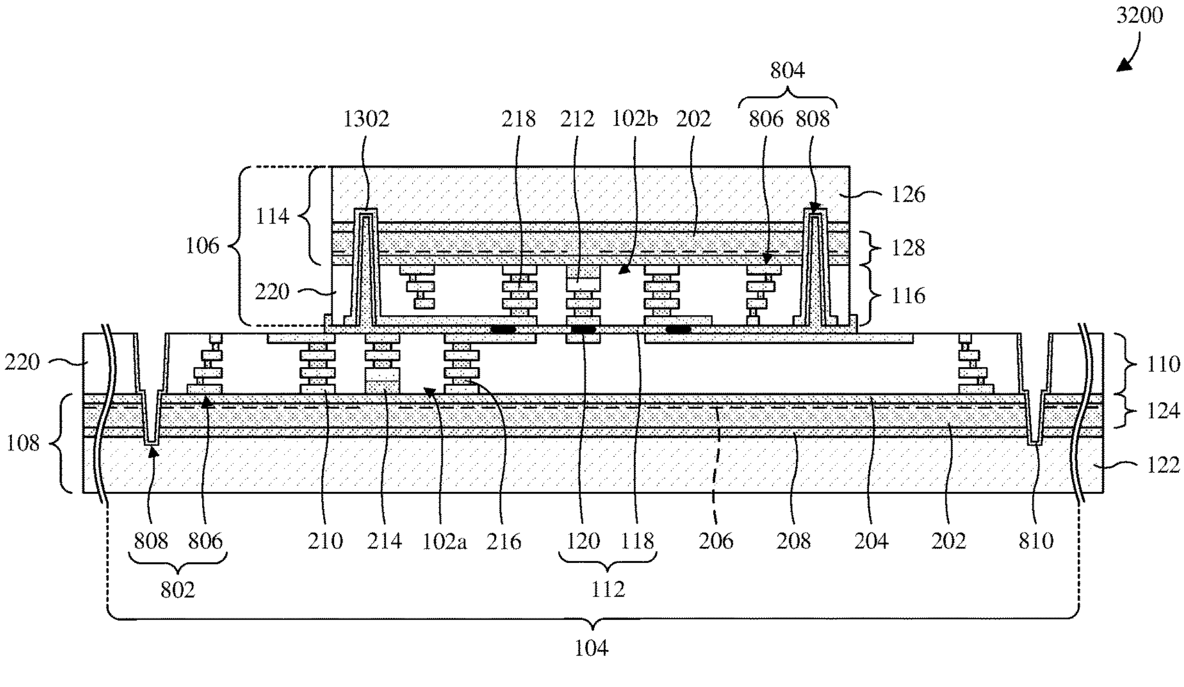

As illustrated by the cross-sectional view 3200 of FIG. 32, the acts described with regard to FIGS. 19, 20, 23, and 24 are performed. A first IC die 104 is formed as described with regard to FIGS. 19 and 20. A singulation process is performed to separate instances of the second IC die 106 from each other as described with regard to FIG. 23. The second IC die 106 is vertically flipped, and is arranged over and bonded to the first IC die 104 as described with regard to FIG. 24.

Figure 33:
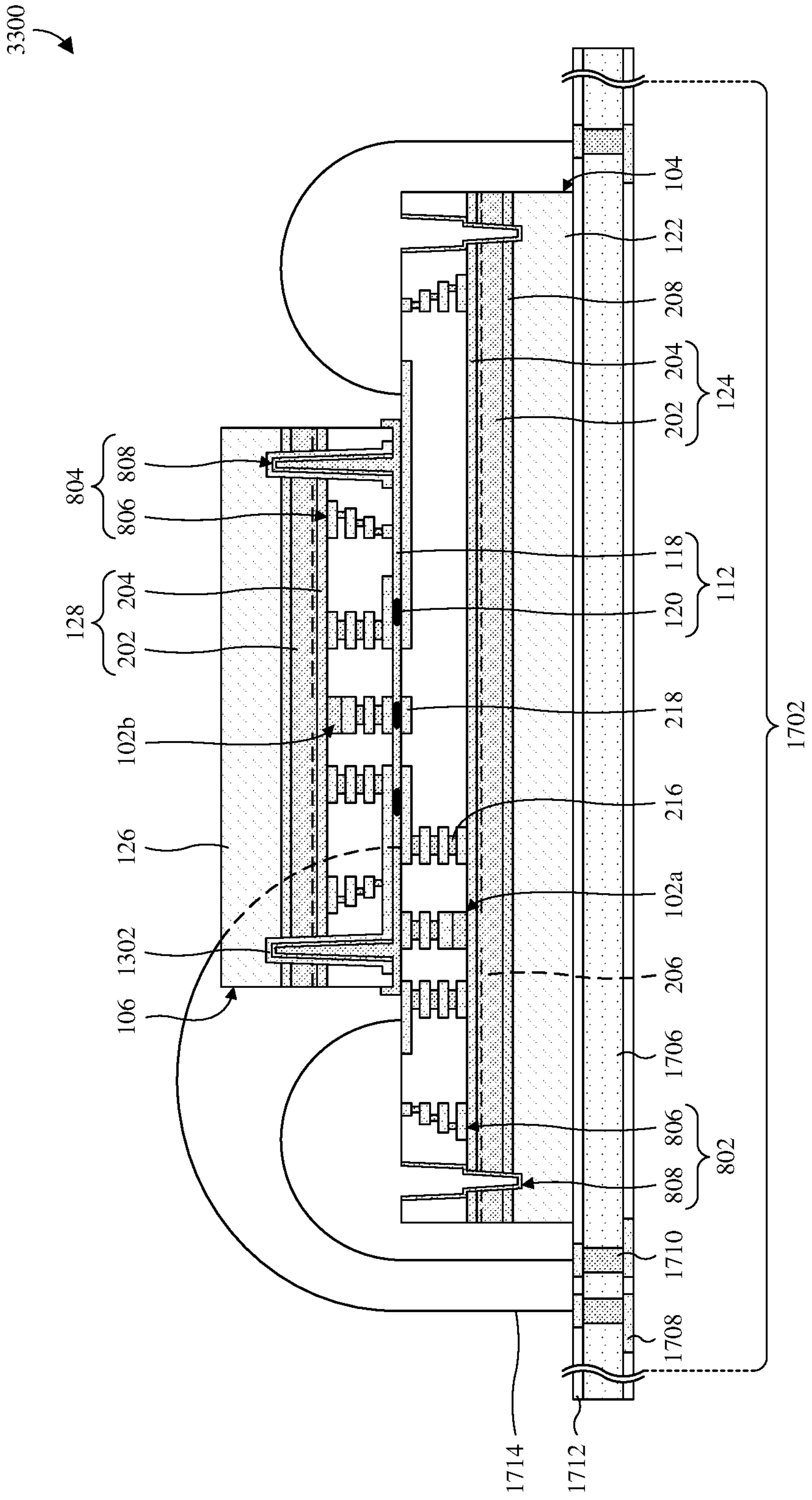

As illustrated by the cross-sectional view 3300 of FIG. 33, the acts described with regard to FIGS. 25 and 26 are performed, except that the substrate wire bond 1714*s* is not formed. More specifically, a singulation process is performed to separate instances of the first IC die 104 from each other as described with regard to FIG. 25. The first and second IC dies 104, 106 are arranged over and bonded to an interposer die 1702 as described with regard to FIG. 26. Further, a plurality of wire bonds 1714, excluding the substrate wire bond 1714*s*, is formed as described with regard to FIG. 26.

The substrate wire bond 1714*s* is not formed because the through semiconductor via 808 of the second seal ring 804 performs the electrical coupling that would otherwise be performed by the substrate wire bond 1714*s*. As noted above, such electrical coupling biases the second carrier substrate 126 to reduce a back gating effect.

Figure 34:
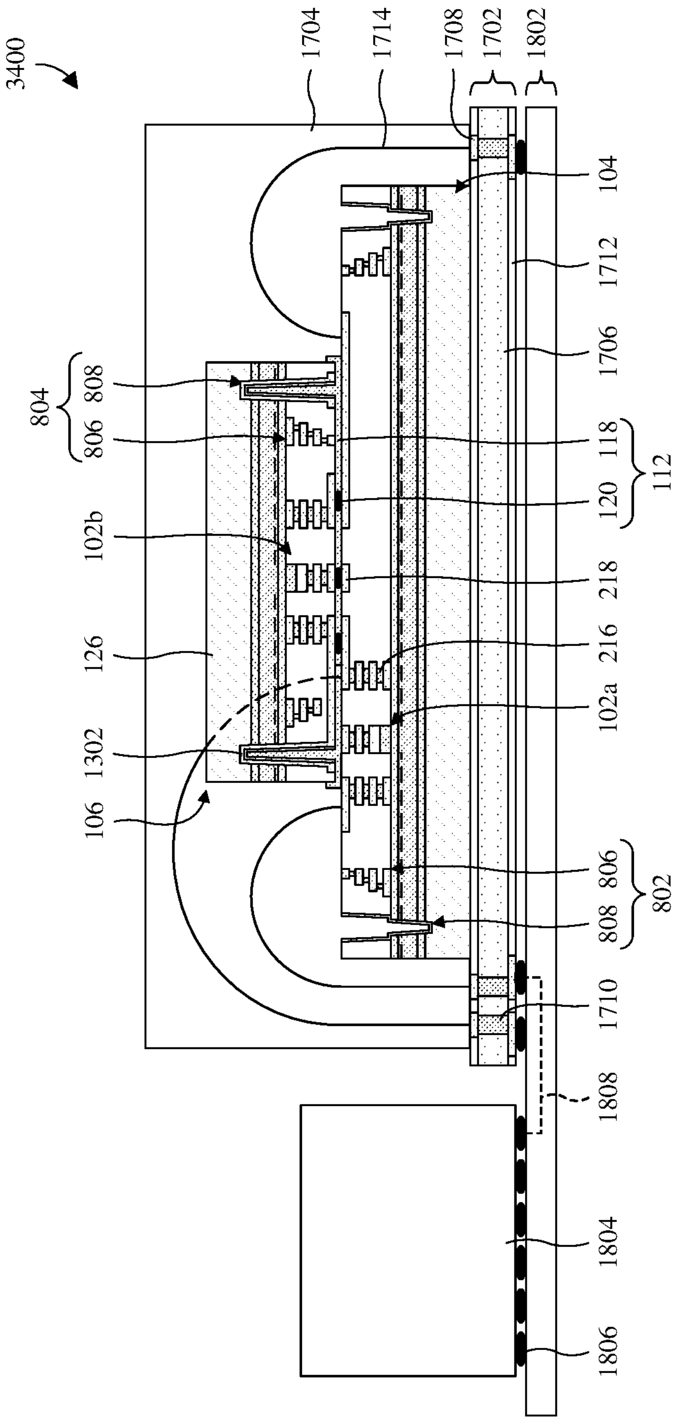

As illustrated by the cross-sectional view 3400 of FIG. 34, the acts described with regard to FIGS. 27-29 are performed. A molding compound 1704 is formed surrounding the first and second IC dies 104, 106 as described with regard to FIG. 27. A singulation process is performed to separate instances of the interposer die 1702 from each other as described with regard to FIG. 28. The interposer die 1702 and a third IC die 1804 are arranged over and is bonded to a second interposer die 1802 as described with regard to FIG. 29.

While FIGS. 31-34 are described with reference to a method, it will be appreciated that the structures shown in FIGS. 31-34 are not limited to the method but rather may stand alone separate of the method. While FIGS. 31-34 are described as a series of acts, it will be appreciated that the order of the acts may be altered in other embodiments. While FIGS. 31-34 illustrate and describe as a specific set of acts, some acts that are illustrated and/or described may be omitted in other embodiments. Further, acts that are not illustrated and/or described may be included in other embodiments.

In some embodiments, the present disclosure provides a semiconductor structure, including: a first IC die including a first substrate and a first semiconductor device on and partially formed by the first substrate; a second IC die overlying the first IC die, and including a second substrate and a second semiconductor device on and partially formed by the second substrate; and a bond structure between the first and second IC dies and bonding the first and second IC dies together; wherein the first and second semiconductor devices include group III-V material. In some embodiments, the first and second semiconductor devices are between the first and second substrates. In some embodiments, the first and second substrates are GaN-on-silicon substrates. In some embodiments, the first substrate includes a semiconductor substrate and a group III-V layer between the semiconductor substrate and the bond structure, wherein the first IC die includes: a through via that extends vertically from the bond structure, through the group III-V layer, to the semiconductor substrate, and that extends laterally along a periphery of the first IC die in a close path around the first semiconductor device. In some embodiments, the second substrate includes a second semiconductor substrate and a second group III-V layer between the second semiconductor substrate and the bond structure, wherein the second IC die includes: a second through via that extends vertically from the bond structure, through the second group III-V layer, to the second semiconductor substrate, and that extends laterally along a periphery of the second IC die in a second closed path around the second semiconductor device. In some embodiments, the first IC die includes an alternating stack of wires and vias forming a conductive wall, wherein the conductive wall extends vertically from the bond structure to an elevation level with the first semiconductor device, and further extends laterally along the periphery of the first IC die in a close path around the first semiconductor device. In some embodiments, the first and second IC dies respectively include a first and second interconnect structure directly contacting the bond structure between the first and second substrates and forming conductive paths electrically coupling the first and second semiconductor devices together to form a half-bridge circuit.

In some embodiments, the present disclosure includes: a first substrate; a first semiconductor device and a first interconnect structure overlying the first substrate, wherein the first semiconductor device is on and partially formed by the first substrate, and is between the first substrate and the first interconnect structure; a second substrate overlying the first substrate and the first interconnect structure; and a second semiconductor device and a second interconnect structure underlying the second substrate, wherein the second semiconductor device is between the second substrate and the second interconnect structure; wherein the first and second substrates include a wide-bandgap semiconductor material with a bandgap greater than a bandgap of silicon. In some embodiments, the semiconductor structure further includes: an interposer underlying the first substrate; and a wire bond extending from the interposer to a pad of the first interconnect structure. In some embodiments, the semiconductor structure further includes a molding compound overlying the interposer and encapsulating the first substrate, the wire bond, and the second substrate. In some embodiments, the second substrate includes a semiconductor substrate and a semiconductor layer underlying the semiconductor substrate, wherein the semiconductor layer includes the wide-bandgap semiconductor material and partially forms the second semiconductor device, and wherein the semiconductor structure includes: a wire bond extending from a pad of the first interconnect structure to the semiconductor substrate. In some embodiments, the semiconductor structure further includes: an interposer underlying the first substrate and electrically coupled to the first and second semiconductor devices; and an IC die on the interposer, adjacent to the first substrate, wherein the IC die is electrically coupled to the first and second semiconductor devices through the interposer. In some embodiments, the first substrate includes a semiconductor substrate and a semiconductor layer overlying the semiconductor substrate, wherein the semiconductor layer includes the wide-bandgap semiconductor material and partially forms the first semiconductor device, and wherein the semiconductor layer is continuous from the first semiconductor device to an outermost sidewall of the semiconductor layer. In some embodiments, the second substrate includes a semiconductor substrate and a semiconductor layer underlying the semiconductor substrate, wherein the semiconductor layer includes the wide-bandgap semiconductor material and partially forms the second semiconductor device, and wherein the semiconductor structure includes: a through via extending through the second interconnect structure and the semiconductor layer to the semiconductor substrate, wherein the through via includes metal.

In some embodiments, the present disclosure provides a method for forming a semiconductor structure, the method including: forming a first IC die repeating across a first substrate that is a wafer, wherein the first IC die includes a first semiconductor device on and partially formed by the first substrate; forming a second IC die including a second semiconductor device on and partially formed by a second substrate; bonding and electrically coupling the first and second IC dies together while the second IC die overlies the first IC die; and singulating the first IC die to separate instances of the first IC die from each other, wherein the singulating of the first IC die is performed after the bonding; wherein the first and second semiconductor devices include group III-V material. In some embodiments, the second substrate is a wafer on which the second IC die repeats, wherein the method further includes: cutting the second substrate to separate instances of the second IC die from each other, wherein the cutting is performed before the bonding. In some embodiments, the first substrate includes a semiconductor substrate and a group III-V layer overlying the semiconductor substrate, wherein the method further includes: performing an etch into the first IC die to form a trench extending vertically through the group III-V layer to the semiconductor substrate, and wherein the trench extends laterally in a closed path around the first semiconductor device. In some embodiments, the second substrate includes a semiconductor substrate and a group III-V layer overlying the semiconductor substrate, wherein the method further includes: performing an etch into the second IC die to form a trench extending vertically through the group III-V layer to the semiconductor substrate, wherein the trench extends laterally in a closed path around the second semiconductor device; and depositing a metal layer lining the trench. In some embodiments, the method further includes bonding the first IC die to a top surface of an interposer, which is on an opposite side of the first IC die as the second IC die; and wire bonding the interposer to the first IC die. In some embodiments, the method further includes forming a molding compound enclosing the first and second IC dies and wire bonds formed by the wire bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, the method comprising:

forming a first integrated circuit (IC) die on a first substrate that is a wafer, wherein the first IC die comprises a first semiconductor device on and partially formed by the first substrate;

forming a second IC die on a second substrate that is a wafer, wherein the second IC die comprises a second semiconductor device on and partially formed by the second substrate;

singulating the second IC die to separate the second IC die from other IC dies on the second substrate;

bonding and electrically coupling the first and second IC dies together while the second IC die overlies the first IC die and after the singulating of the second IC die; and singulating the first IC die to separate the first IC die from other IC dies on the first substrate after the bonding;

wherein the first and second semiconductor devices comprise group III-V material.

2. The method according to claim 1, wherein the singulating of the second IC die comprises cutting the second substrate to separate the second IC die from the other IC dies on the second substrate, wherein the other IC dies on the second substrate correspond to repetitions of the second IC die.

3. The method according to claim 1, wherein the first substrate comprises a semiconductor substrate and a group III-V layer overlying the semiconductor substrate, and wherein the method further comprises:

performing an etch into the first IC die to form a trench extending vertically through the group III-V layer to the semiconductor substrate, and wherein the trench extends laterally in a closed path around the first semiconductor device.

4. The method according to claim 1, wherein the second substrate comprises a semiconductor substrate and a group III-V layer overlying the semiconductor substrate, and wherein the method further comprises:

performing an etch into the second IC die to form a trench extending vertically through the group III-V layer to the semiconductor substrate, and wherein the trench extends laterally in a closed path around the second semiconductor device; and depositing a metal layer lining the trench.

5. The method according to claim 1, further comprising:

bonding the first IC die to a top surface of an interposer, which is on an opposite side of the first IC die as the second IC die; and wire bonding the interposer to the first IC die.

6. The method according to claim 5, further comprising: forming a molding compound enclosing the first and second IC dies and wire bonds formed by the wire bonding.

7. The method according to claim 1, wherein the first and second semiconductor devices correspond to transistors and have individual source/drain regions electrically coupled together at completion of the bonding.

8. A method for forming a semiconductor structure, the method comprising:

forming a first semiconductor device over a first group III-V layer, which overlies a first semiconductor substrate;

forming a first interconnect structure overlying and electrically coupled to the first semiconductor device;

forming a first ring-shaped trench extending through the first group III-V layer to the first semiconductor substrate after forming the first interconnect structure;

forming a second semiconductor device over a second group III-V layer, which overlies a second semiconductor substrate;

forming a second interconnect structure overlying and electrically coupled to the second semiconductor device; and bonding and electrically coupling the first and second interconnect structures together, such that the first and second semiconductor devices are between the first and second semiconductor substrates.

9. The method according to claim 8, wherein an outermost edge of the second semiconductor substrate overlies the first semiconductor device after the bonding.

10. The method according to claim 8, wherein a pad of the first interconnect structure is exposed at completion of the bonding, and wherein the method further comprises:

forming a wire bond extending from the pad to the second semiconductor substrate.

11. The method according to claim 8, further comprising: forming a second ring-shaped trench extending through the second group III-V layer to the second semiconductor substrate after forming the second interconnect structure.

12. The method according to claim 11, wherein the first ring-shaped trench completely surrounds the second ring-shaped trench when viewed top down.

13. The method according to claim 11, wherein the second ring-shaped trench is filled with metal and extends to a bond structure between and electrically coupled to the first and second interconnect structures.

14. The method according to claim 8, wherein the first and second semiconductor substrates correspond to wafers, and wherein the method further comprises:

before the bonding, singulating the second semiconductor substrate to separate an IC die, which comprises the second semiconductor device and the second interconnect structure, from other IC dies on the second semiconductor substrate; and after the bonding, singulating the first semiconductor substrate to separate an IC die, which comprises the first semiconductor device and the first interconnect structure, from other IC dies on the first semiconductor substrate.

15. A method for forming a semiconductor structure, the method comprising:

forming a first integrated circuit (IC) die on a first wafer, wherein the first IC die comprises a first semiconductor device;

forming a second IC die on a second wafer, wherein the second IC die comprises a second semiconductor device;

bonding and electrically coupling the second IC die to the first IC die; and bonding the first IC die to an interposer, which is on an opposite side of the first IC die as the second IC die; and wire bonding the interposer to the first IC die;

wherein the first and second semiconductor devices comprise a wide-bandgap semiconductor material with a bandgap greater than a bandgap of silicon.

16. The method according to claim 15, further comprising:

wire bonding the first IC die to the second IC die.

17. The method according to claim 15, further comprising:

forming a molding layer overlying the interposer and surrounding the first and second IC dies, wherein the interposer is part of an interposer wafer during the forming of the molding layer; and singulating the interposer wafer to separate the interposer from other interposers on the interposer wafer.

18. The method according to claim 15, wherein the first wafer comprises a first silicon substrate and a layer of the wide-bandgap semiconductor material overlying the first silicon substrate, and wherein the first silicon substrate has a resistance of less than about 30 ohms/centimeter.

19. The method according to claim 15, further comprising:

bonding the interposer to an additional interposer, which electrically couples the interposer to a third IC die bonded to the additional interposer.

20. The method according to claim 15, wherein the first semiconductor device and the second semiconductor device respectively comprise a first gate electrode and a second gate electrode, and wherein the second gate electrode overlies the first gate electrode.

* * * * *